(12) United States Patent
Katta et al.

(10) Patent No.: US 10,627,367 B2
(45) Date of Patent: Apr. 21, 2020

(54) LIQUID SPECIMEN SENSOR AND METHOD OF MEASURING LIQUID SPECIMEN

(71) Applicant: KYOCERA CORPORATION, Kyoto (JP)

(72) Inventors: Hiroshi Katta, Kyoto (JP); Hiroyasu Tanaka, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 248 days.

(21) Appl. No.: 15/562,386

(22) PCT Filed: Mar. 30, 2016

(86) PCT No.: PCT/JP2016/060445
§ 371 (c)(1),
(2) Date: Sep. 27, 2017

(87) PCT Pub. No.: WO2016/159112
PCT Pub. Date: Oct. 6, 2016

(65) Prior Publication Data
US 2018/0284068 A1    Oct. 4, 2018

(30) Foreign Application Priority Data

Mar. 30, 2015   (JP) ................................ 2015-070168

(51) Int. Cl.
*G01N 29/02*   (2006.01)
*G01N 5/02*   (2006.01)
(Continued)

(52) U.S. Cl.
CPC .............. *G01N 29/02* (2013.01); *G01N 5/02* (2013.01); *G01N 29/024* (2013.01);
(Continued)

(58) Field of Classification Search
CPC ........ G01N 5/02; G01N 29/02; G01N 29/222; G01N 2291/0256; G01N 2291/0423; H03H 9/64; H03H 9/145
See application file for complete search history.

(56) References Cited

U.S. PATENT DOCUMENTS

| 3,757,256 A | * | 9/1973 | Whitehouse | ........... G06G 7/195 |
| | | | | 333/151 |
| 4,932,255 A | * | 6/1990 | Brace | ........................ G01F 1/66 |
| | | | | 310/313 R |

(Continued)

FOREIGN PATENT DOCUMENTS

| JP | 2014-009955 A | 1/2014 |
| JP | 2014-112084 A | 6/2014 |

(Continued)

OTHER PUBLICATIONS

International Search Report dated Jun. 14, 2016, in corresponding International Application No. PCT/JP2016/060445.

*Primary Examiner* — David J Bolduc
(74) *Attorney, Agent, or Firm* — Duane Morris LLP

(57) ABSTRACT

A liquid specimen sensor includes a pair of first IDT electrodes and a pair of second IDT electrodes, a pair of first input connection conductors connected to one of the pair of first IDT electrodes and extending to the outside of the flow path, a pair of first output connection conductors connected to the other of the pair of first IDT electrodes and extending to the outside of the flow path, a pair of second input connection conductors connected to one of the pair of second IDT electrodes and extending to the outside of the flow path, and a pair of second output connection conductors connected to the other of the pair of second IDT electrodes and extending to the outside of the flow path. The sum of the line lengths in the flow path of the pair of first input connection conductors and the pair of first output connection (Continued)

conductors and the sum of the line lengths in the flow path of the pair of second input connection conductors and the pair of second output connection conductors are equal.

16 Claims, 10 Drawing Sheets

(51) Int. Cl.

| | | |
|---|---|---|
| *G01N 29/44* | (2006.01) | |
| *G01N 29/024* | (2006.01) | |
| *G01N 29/32* | (2006.01) | |
| *G01N 29/24* | (2006.01) | |
| *H03H 9/145* | (2006.01) | |
| *G01N 29/22* | (2006.01) | |
| *H03H 9/64* | (2006.01) | |
| *H03H 9/02* | (2006.01) | |

(52) U.S. Cl.
CPC ....... *G01N 29/222* (2013.01); *G01N 29/2468* (2013.01); *G01N 29/32* (2013.01); *G01N 29/4436* (2013.01); *H03H 9/145* (2013.01); *H03H 9/64* (2013.01); *G01N 2291/012* (2013.01); *G01N 2291/0256* (2013.01); *G01N 2291/048* (2013.01); *G01N 2291/0423* (2013.01); *G01N 2291/102* (2013.01); *H03H 9/02992* (2013.01)

(56) References Cited

U.S. PATENT DOCUMENTS

| | | | | |
|---|---|---|---|---|
| 5,325,704 A | * | 7/1994 | Mariani | ............... G01N 29/022 |
| | | | | 310/313 B |
| 6,327,890 B1 | * | 12/2001 | Galipeau | ................ G01N 25/68 |
| | | | | 310/313 B |
| 6,577,210 B1 | * | 6/2003 | Tsutsumi | ................. H03H 9/64 |
| | | | | 310/313 D |
| 7,716,986 B2 | | 5/2010 | Sung et al. | |
| 2003/0196477 A1 | * | 10/2003 | Auner | .................... B82Y 10/00 |
| | | | | 73/24.06 |
| 2006/0049714 A1 | * | 3/2006 | Liu | ....................... G01N 29/022 |
| | | | | 310/313 R |
| 2006/0254356 A1 | * | 11/2006 | Liu | ....................... G01N 29/022 |
| | | | | 73/592 |
| 2011/0309896 A1 | * | 12/2011 | Loseu | ...................... H03H 9/64 |
| | | | | 333/195 |
| 2012/0073390 A1 | * | 3/2012 | Zaghloul | ............ G01N 29/022 |
| | | | | 73/865 |
| 2012/0319802 A1 | * | 12/2012 | Ochiai | ................. H03H 9/1092 |
| | | | | 333/193 |
| 2015/0017735 A1 | | 1/2015 | Katta | |
| 2015/0263698 A1 | * | 9/2015 | Tanaka | ............... H03H 9/02622 |
| | | | | 310/313 C |
| 2015/0362463 A1 | * | 12/2015 | Ohashi | .................... F01D 5/082 |
| | | | | 73/64.53 |
| 2015/0362464 A1 | * | 12/2015 | Tanaka | ................. G01N 29/022 |
| | | | | 73/649 |
| 2016/0169874 A1 | | 6/2016 | Tanaka et al. | |
| 2016/0195498 A1 | * | 7/2016 | Katta | ................... G01N 29/022 |
| | | | | 436/501 |
| 2016/0325282 A1 | * | 11/2016 | Kurioka | ............... G01N 29/022 |
| 2017/0099043 A1 | * | 4/2017 | Goto | ........................ H03H 9/64 |
| 2017/0199180 A1 | * | 7/2017 | Kobayashi | ............. H03H 9/145 |
| 2017/0222623 A1 | * | 8/2017 | Nomura | .................. H03J 3/185 |

FOREIGN PATENT DOCUMENTS

| | | | | |
|---|---|---|---|---|
| JP | 2015-25658 A | | 2/2015 | |
| WO | WO-2013015443 A1 | * | 1/2013 | ........... G01N 29/022 |
| WO | 2014/069063 A1 | | 5/2014 | |
| WO | WO-2014069063 A1 | * | 5/2014 | |
| WO | 2014/119069 A1 | | 8/2014 | |
| WO | 2015/025946 A1 | | 2/2015 | |
| WO | WO-2015025946 A1 | * | 2/2015 | |

* cited by examiner

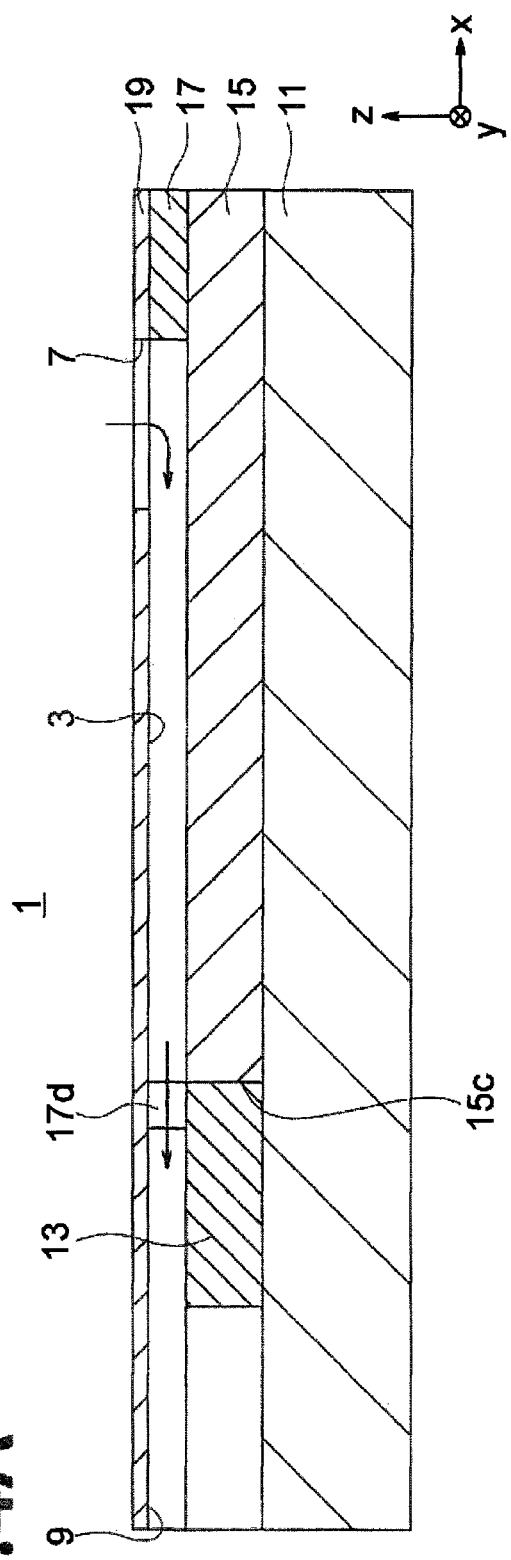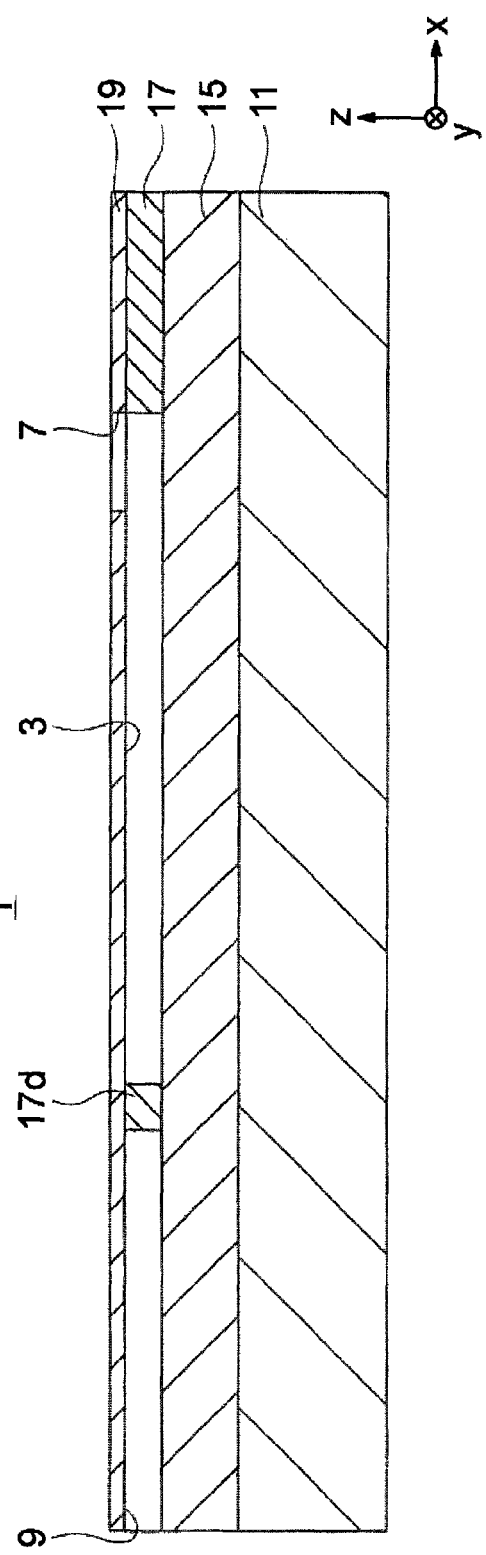

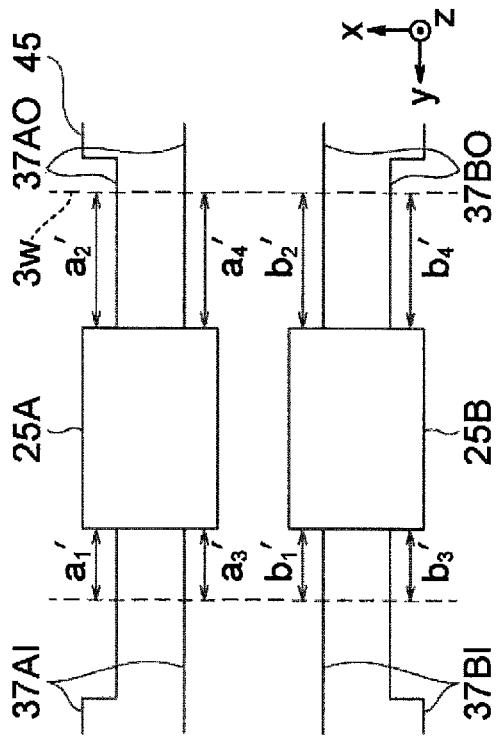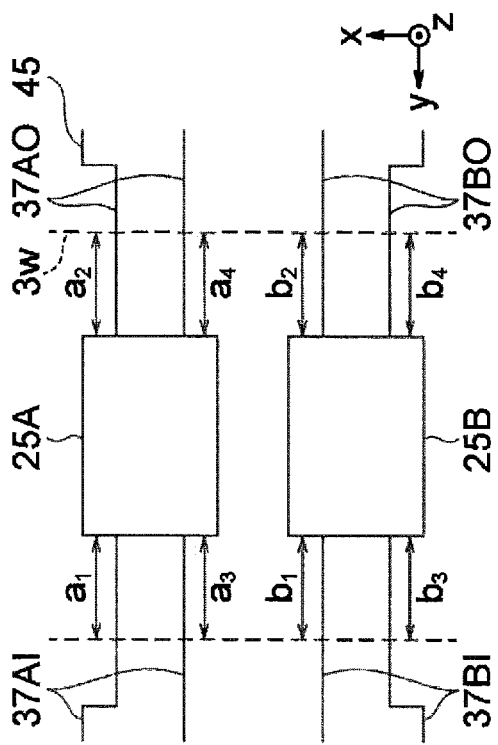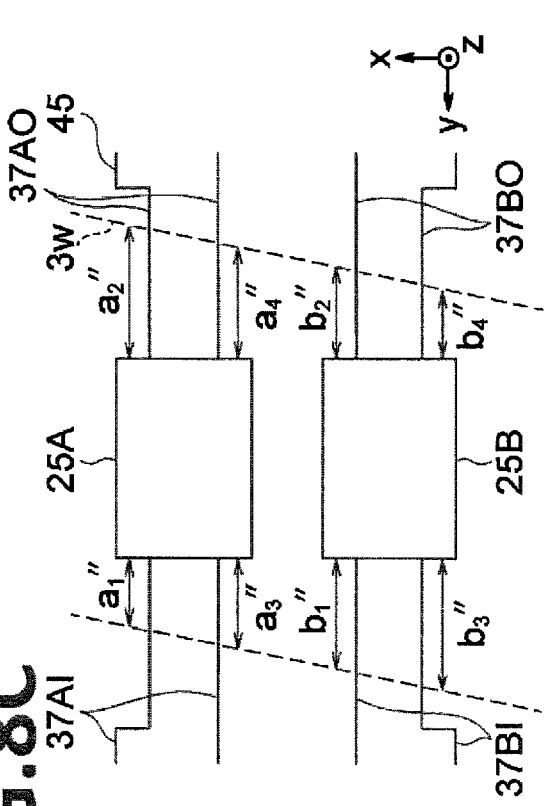

LIQUID SPECIMEN SENSOR AND METHOD OF MEASURING LIQUID SPECIMEN

TECHNICAL FIELD

The present invention relates to a sensor capable of measuring a property of a liquid or ingredient contained in the liquid. Note that, the liquid only has to be one having fluidity and may have a high viscosity.

BACKGROUND ART

Known in the art is a liquid specimen sensor in which a liquid specimen is placed between a pair of IDT (interdigital transducer) electrodes and a property or ingredient of the liquid specimen are measured based on the influence of that liquid specimen exerted upon a signal transmitted and received between the pair of IDT electrodes (for example Patent Literature 1 and 2).

In Patent Literature 1, each of the pair of IDT electrodes is covered by a cover etc. whereby a flow path in which the liquid specimen flows is formed between the pair of IDT electrodes. Due to this, the liquid specimen is guided between the pair of IDT electrodes, and contact of the liquid specimen with the IDT electrodes and connection conductors connecting the IDT electrodes with external terminals is suppressed.

Further, in Patent Literature 2, in a top surface of a space holding the pair of IDT electrodes, a hydrophilic region positioned above the gap between the pair of IDT electrodes and a hydrophobic region positioned just above the pair of IDT electrodes are formed. Due to this, the liquid specimen is guided to the gap between the pair of IDT electrodes, and contact of the liquid specimen with the IDT electrodes and connection conductors connecting the IDT electrodes with external terminals is suppressed. That is, a range forming a flow path is defined not by flow path walls, but by a hydrophilic region.

In the art of Patent Literature 1, covers must be provided, while in the art of Patent Literature 2, a hydrophilic region and hydrophobic region must be formed, so the configuration is complex in both of the cases. As a result, for example, a rise in cost is liable to be invited. On the other hand, unless contact of the liquid specimen with the IDT electrodes and connection conductors is suppressed as in Patent Literature 1 or 2, for example, the permittivity at the periphery of the connection conductors will vary due to fluctuation of the contact length between the liquid specimen and the connection conductors. As a result, the detection accuracy may fall.

Accordingly, provision of a liquid specimen sensor having a simple configuration capable of improving the detection accuracy and a measurement method of a liquid specimen using the liquid specimen sensor is desirable.

CITATION LIST

Patent Literature

Patent Literature 1: Japanese Patent Publication No. 2014-9955A
Patent Literature 2: International Publication No. 2014/069063A

SUMMARY OF INVENTION

A liquid specimen sensor according to one aspect of the present invention includes a pair of first IDT electrodes and a pair of second IDT electrodes including at least parts located in a flow path, a pair of first input conductors connected to one of the pair of first IDT electrodes and extending to an outside of the flow path, a pair of first output conductors connected to the other of the pair of first IDT electrodes and extending to the outside of the flow path, a pair of second input conductors connected to one of the pair of second IDT electrodes and extending to the outside of the flow path, and a pair of second output conductors connected to the other of the pair of second IDT electrodes and extending to the outside of the flow path. A sum of line lengths in the flow path of the pair of first input conductors and the pair of first output conductors and a sum of line lengths in the flow path of the pair of second input conductors and the pair of second output conductors are equal.

A liquid specimen sensor according to an aspect of the present invention includes a sensor substrate; a pair of inner wall surfaces arranged on the sensor substrate, facing each other, and configured to be as a side surfaces of the flow path on the sensor substrate; and a sensor chip which is located on the sensor substrate and includes a pair of IDT electrodes located in the flow path and on an upper surface of the sensor chip. The sensor substrate includes a pair of input layered conductors including first ends located in the flow path and electrically connected to one of the pair of IDT electrodes and including the other ends located outside of the flow path, and a pair of output layered conductors including first ends located in the flow path and electrically connected to the other of the pair of IDT electrodes and including the other ends located outside of the flow path. The pair of input layered conductors extend parallel to a predetermined direction from the first ends located in the flow path up to one of the pair of inner wall surfaces. The pair of output layered conductors extend parallel to the predetermined direction from the first ends located in the flow path up to the other of the pair of inner wall surfaces.

A method of measuring a liquid specimen according to an aspect of the present invention is a measurement method measuring a property or ingredient of the liquid specimen by the liquid specimen sensor described above. The method includes, in a state filling the liquid specimen in a portion in the flow path in which the pair of first input conductors, the pair of first output conductors, the pair of second input conductors, and the pair of second output conductors are arranged, inputting a signal to the pair of first input conductors and detecting a signal output from the pair of first output conductors, and inputting a signal to the pair of second input conductors and detecting a signal output from the pair of second output conductors.

According to the above configurations, the detection accuracy can be improved, and the configuration is easy.

BRIEF DESCRIPTION OF DRAWINGS

FIG. 4A is a cross-sectional view taken along a line IVa-IVa in FIG. 3, and FIG. 4B is a cross-sectional view taken along a line IVb-IVb in FIG. 3.

FIG. 8A to FIG. 8C are schematic views for explaining the mode of operation according to the shapes etc. of the lines in the sensor.

DESCRIPTION OF EMBODIMENTS

Figure 1:
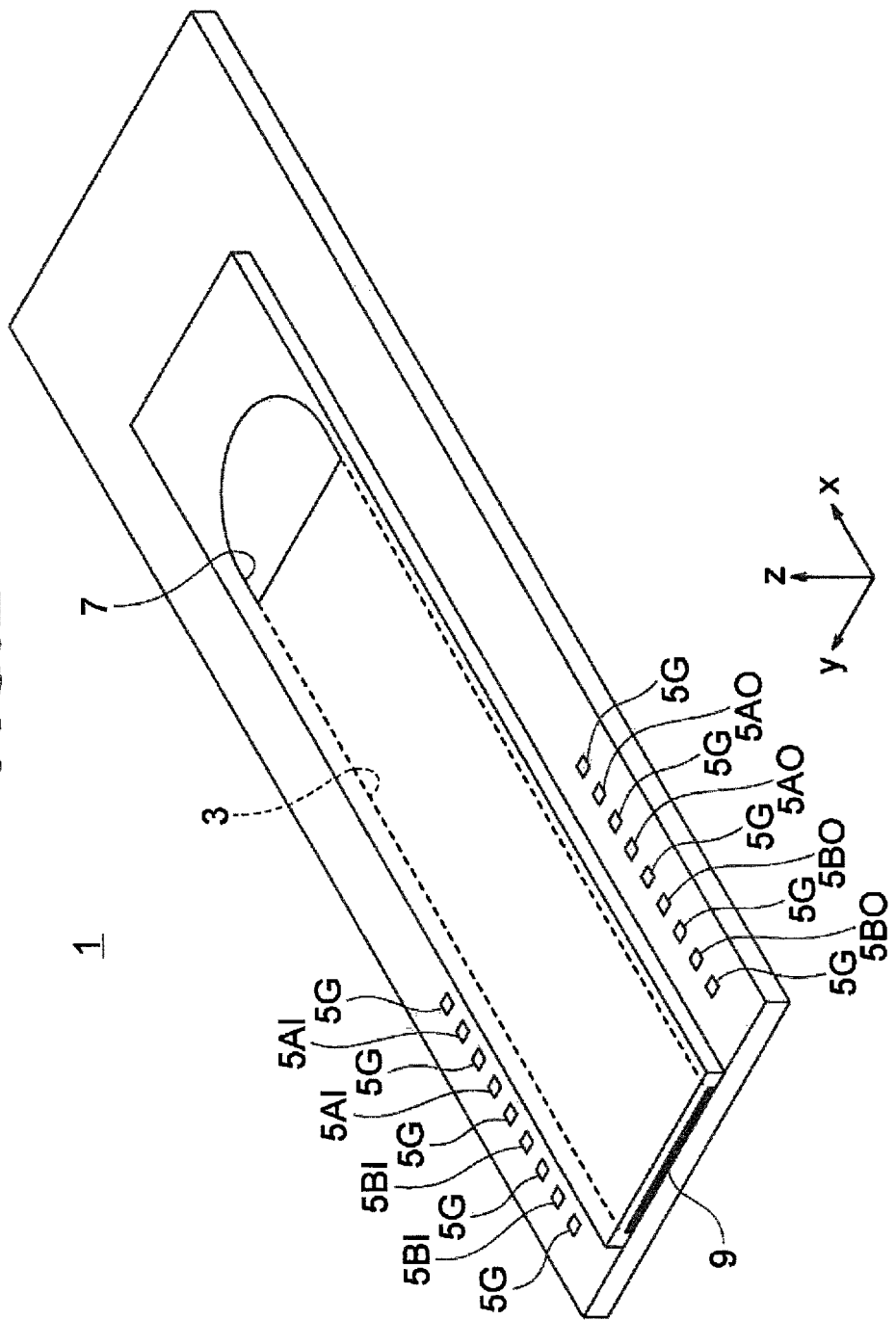
FIG. 1 A perspective view showing a sensor according to a first embodiment of the present invention.

Embodiments of a sensor according to the present invention will be explained in detail below with reference to the drawings. Note that, the same or similar configurations will be sometimes designated by attaching numbers etc. and letters which are different from each other with respect to the same terms like the "first sensor part 25A" and "second sensor part 25B". Further, in this case, sometimes they will be simply referred to as the "sensor parts 25" and will not be distinguished.

Further, in the sensor, any direction may be defined as the upper part or lower part. In the following description, however, for convenience, an orthogonal coordinate system xyz will be defined, the positive side in the z-direction will be defined as the upper part, and the "upper surface", "lower surface", and other words will be used. In the drawings, the portions are schematically shown, and sizes etc. of the portions are sometimes different from actual ones.

First Embodiment (Outline of Configuration)

FIG. 1 is a perspective view showing a sensor 1 (liquid specimen sensor) according to an embodiment of the present invention.

The sensor 1 is for example formed in a substantially rectangular plate shape as a whole. The thickness thereof is for example 0.5 mm to 3 mm, the length in the x-direction is for example 1 cm to 5 cm, and the length in the y-direction is for example 1 cm to 3 cm.

The sensor 1 for example has a flow path 3 in which a liquid specimen (for example blood or diluted blood) flows, and a plurality of (18 in the present embodiment) external terminals 5 (5AI, 5AO, 5BI, 5BO, and 5G) provided for input/output of electrical signals.

The sensor 1 is for example mounted in a not shown reader including an oscillation circuit etc. The mounting is for example carried out by inserting an end part of the sensor 1 on the plurality of external terminal 5 side (negative side in the x-direction) into a slot of the reader. Further, the sensor 1 changes an electrical signal input to any of the plurality of external terminals 5 from the reader in accordance with a property and/or ingredient of the liquid specimen in the flow path 3 (hereinafter, basically only an ingredient will be referred to) and outputs the result from any of the plurality of external terminals 5 to the reader. The sensor 1 is for example a disposable sensor.

The flow path 3 for example extends in an inside of the sensor 1. The two ends are opened to the outside of the sensor 1. One end of the flow path 3 becomes an inflow port 7 for introducing the liquid specimen into the flow path 3, while the other end of the flow path 3 becomes an exhaust port 9 for exhausting gas in the flow path 3 along with the inflow of the liquid specimen into the flow path 3. When the liquid specimen is supplied to the inflow port 7, for example, it flows in the flow path 3 toward the exhaust port 9 by capillary action (capillarity).

The shapes and positions of the flow path 3, inflow port 7, and exhaust port 9 may be suitably set. For example, the flow path 3 linearly extends in a longitudinal direction (x-direction) of the sensor 1 and has a schematically constant width (y-direction) over its entirety. The thickness (height, z-direction) of the flow path 3 is made relatively small so that a capillary action easily occurs. For example, the thickness is 50 μm to 0.5 mm. The inflow port 7 is for example opened in a substantially semi-circular shape in the upper surface of the sensor 1 at the position which is slightly offset to the end part side (positive side in the x-direction) from the center of the rectangle of the upper surface. The exhaust port 9 is for example opened in a slit shape in the end face in the longitudinal direction of the sensor 1 (surface facing the negative side in the x-direction) so as to extend in the width direction of the sensor 1.

The external terminals 5 are for example exposed at the upper surface of the sensor 1. Their planar shapes may be suitably set. For example, they may be rectangular. The number and arrangement of the plurality of external terminals 5 may be suitably set in accordance with the circuit configuration of the internal portion of the sensor 1, the configuration of a not shown reader in which the sensor 1 is mounted or the like. In the present embodiment, the plurality of external terminals 5 are arranged along the flow path 3 on the two sides of the flow path 3. Those total two columns of external terminals 5 are arranged line-symmetrical relative to the flow path 3.

Figure 2:
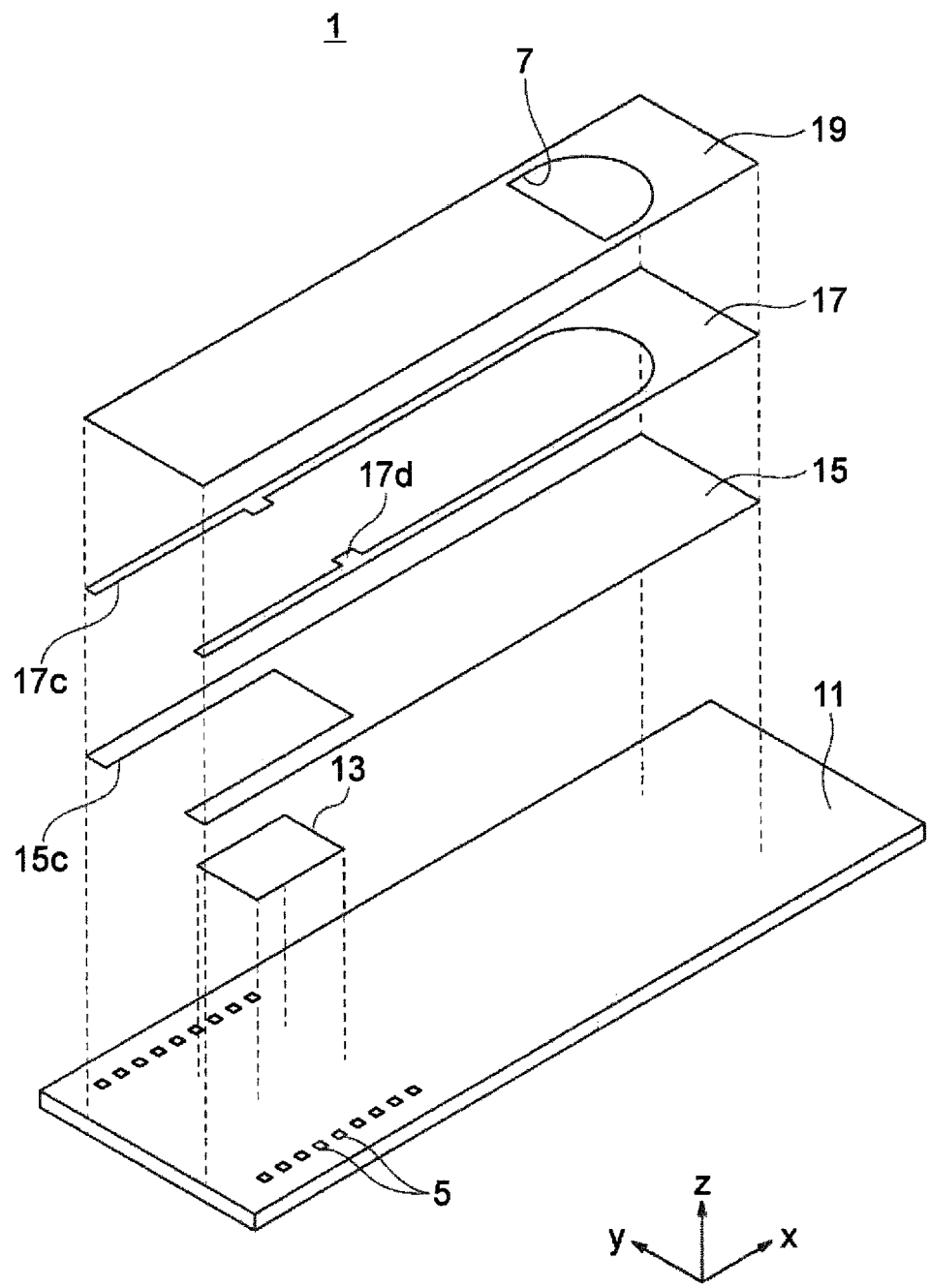
FIG. 2 A disassembled perspective view of the sensor in FIG. 1.

FIG. 2 is a disassembled perspective view of the sensor 1.

The sensor 1 is for example configured by layered members etc. stacked together (part arranged in parallel) and fixed. Specifically, for example, from the bottom, the sensor 1 has, in order, a sensor substrate 11 having external terminals 5, a sensor chip 13 mounted on the sensor substrate 11, and a first layer member 15, second layer member 17, and third layer member 19 for configuring the flow path 3. Note that, the sensor chip 13 and the first layer member 15 and second layer member 17 are arranged in parallel on the sensor substrate 11.

The sensor substrate 11 is for example given the same configuration as that of a printed wiring board. The sensor substrate 11 may be a rigid type substrate which does not have flexibility or may be a flexible substrate having flexibility. The insulating substrate of the sensor substrate 11 is for example configured mainly by a resin or ceramic. The planar shape of the sensor substrate 11, as understood from a comparison between FIG. 1 and FIG. 2, is for example the same as the planar shape of the sensor 1.

The sensor chip 13 is a portion which receives as input a signal through the sensor substrate 11 from a not shown reader, changes the input signal in accordance with an ingredient of the liquid specimen, and outputs the signal after the change through the sensor substrate 11 to the reader and is substantially the portion for detecting the ingredient of the liquid specimen. The sensor chip 13 is for example configured in a schematically thin rectangular cuboid shape, is fixed on the upper surface of the sensor substrate 11, and is electrically connected to the sensor substrate 11. The sensor chip 13 is smaller compared with the sensor substrate 11 and is positioned between the two columns of external terminals 5.

The first layer member 15, second layer member 17, and third layer member 19 are layered members which are stacked on each other on the sensor substrate 11. Hollow parts (first cutaway part 15c and second cutaway part 17c in the present embodiment) are formed in the first layer member 15 and second layer member 17. Due to this, between the sensor substrate 11 and the third layer member 19, a space for arrangement of the sensor chip 13 is secured and the flow path 3 is formed. Note that, the already explained inflow port 7 is formed in the third layer member 19. Further, the exhaust port 9 is configured between the sensor substrate 11 and the third layer member 19 by the first cutaway part 15c and second cutaway part 17c being opened to the negative side in the x-direction.

The first layer member 15, second layer member 17, and third layer member 19 are for example configured by a resin or ceramic or other insulating material and are adhered to each other and are adhered to the sensor substrate 11 by an adhesive. Note that, these layer members (15, 17, and 19) may have flexibility or may not. Each layer member may be formed by one integrally formed layer member or may be one configured by stacking integrally formed layers. Any layer member (for example second layer member 17) may be configured by double-sided tape as well.

The external profiles (excluding cutaway parts) of the planar shapes of the first layer member 15, second layer member 17, and third layer member 19 are for example given the same sizes and shapes as each other. The edge parts thereof match with each other. For example, the external profiles of these planar shapes are rectangular. The widths (y-direction) of these layer members (15, 17, and 19) are for example made smaller than the width of the sensor substrate 11. Due to this, for example, the external terminals 5 are exposed on the upper surface side of the sensor 1 on the two sides of the flow path 3. Further, the lengths (x-direction) of the layer members are made shorter than the length of the sensor substrate 11. Due to this, for example, it becomes possible to hold the end part of the sensor substrate 11 on the positive side in the x-direction by sandwiching it between fingers or the like, therefore the handleability of the sensor 1 is improved.

(Shape of Flow Path)

Figure 3:
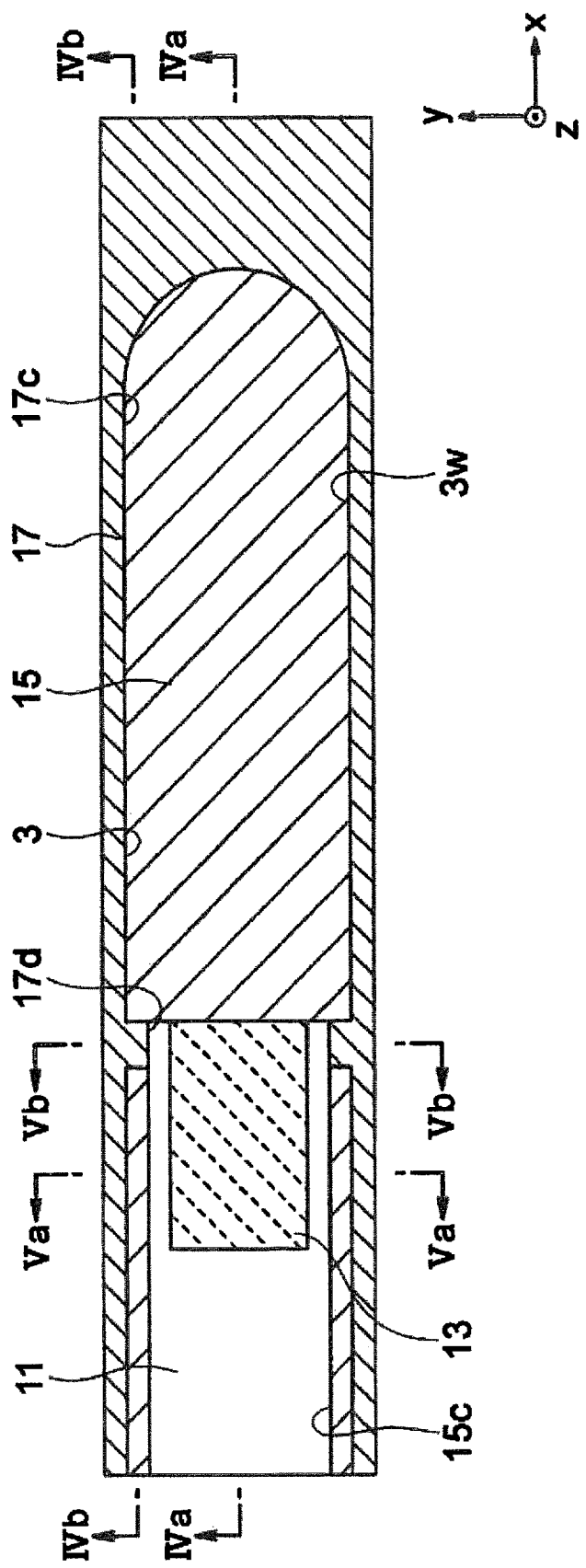
FIG. 3 A top view of the sensor shown by detaching a member in the uppermost layer from the sensor in FIG. 1.
Figure 5A:
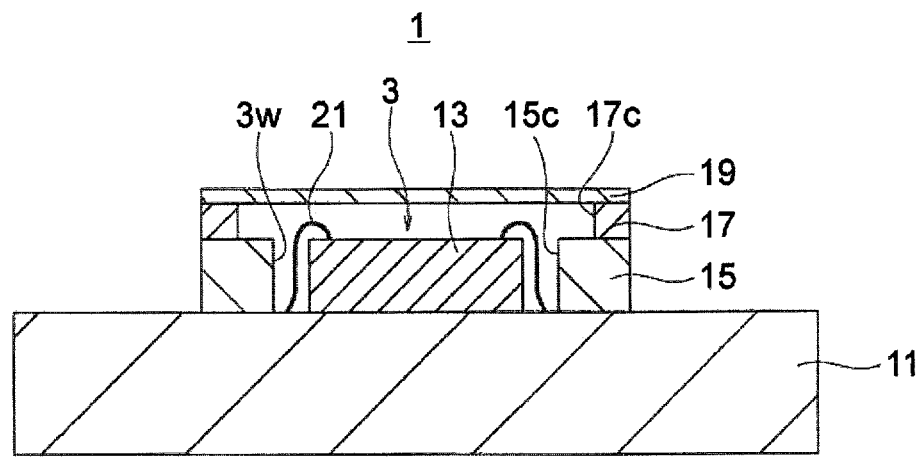
FIG. 5A is a cross-sectional view taken along a line Va-Va in FIG. 3.
Figure 5B:
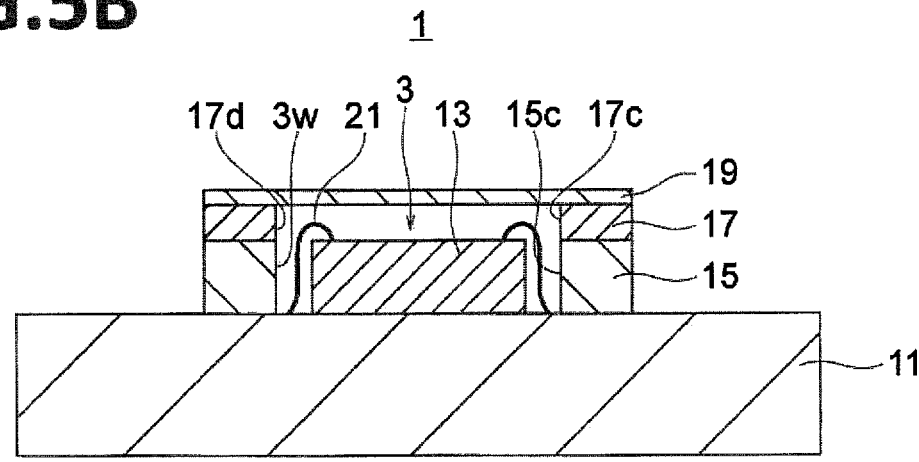
FIG. 5B is a cross-sectional view taken along a line Vb-Vb in FIG. 3.

FIG. 3 is a top view of the sensor 1 shown by detaching the third layer member 19 from the sensor 1. Note that, this figure is not a cross-sectional view, but different types of hatching are applied to each member for making the range of each member easier to see. Further, FIG. 4A is a cross-sectional view taken along the line IVa-IVa in FIG. 3, FIG. 4B is a cross-sectional view taken along the IVb-IVb line in FIG. 3, FIG. 5A is a cross-sectional view taken along the line Va-Va in FIG. 3, and FIG. 5B is a cross-sectional view taken along the line Vb-Vb in FIG. 3.

As shown in FIG. 2, the first cutaway part 15c is formed smaller than the second cutaway part 17c in the x-direction. Accordingly, as particularly expressed in FIG. 4A, the flow path 3 has a portion which is configured between the first layer member 15 and the third layer member 19 with the thickness of the second layer member 17 (the portion on the right side on the drawing sheet in FIG. 4A) and a portion which is configured between the sensor substrate 11 and the third layer member 19 with a total thickness of the first layer member 15 and second layer member 17 (the portion on the left side on the drawing sheet in FIG. 4A).

Specifically, for example, as shown in FIG. 2, the second cutaway part 17c extends from the position superimposed on the inflow port 7 up to the end part on the negative side in the x-direction, while the first cutaway part 15c extends from the middle of the second cutaway part 17c up to the end part on the negative side in the x-direction. Accordingly, as expressed in FIG. 3 and FIG. 4A, basically, in the flow path 3, the upstream side part extending from the inflow port 7 is configured between the first layer member 15 and the third layer member 19, and the downstream side part continuing to the exhaust port 9 is configured between the sensor substrate 11 and the third layer member 19.

Further, for example, as shown in FIG. 3, in the downstream side part of the flow path 3, the width (y-direction) of the first cutaway part 15c is made a bit smaller than the width of the second cutaway part 17c. Accordingly, as expressed in FIG. 3, FIG. 4B, and FIG. 5A, even in the downstream side part of the flow path 3, the portions configured between the first layer member 15 and the third layer member 19 are positioned on the two sides of the side (y-direction) in the flow direction.

As shown in FIG. 3, the sensor chip 13 is held in the first cutaway part 15c. Accordingly, as shown in FIG. 4A, in the flow path 3, the bottom face (upper surface of the first layer member 15) of the upstream side part from the sensor chip 13 approaches the upper surface of the sensor chip 13 (becomes closer to becoming flush) compared with the case where this bottom face is configured by the upper surface of the sensor substrate 11 or becomes flush. Due to this, for example, the liquid specimen can more easily flow from the flow path 3 to the upper surface of the sensor chip 13. Note that, preferably there is no clearance between the upper surface of the sensor chip 13 and the upper surface of the first layer member 15 positioned on the upstream side thereof (the sensor chip 13 is made to abut against the first cutaway part 15c in the x-direction) or the clearance is made relatively small.

As shown in FIG. 3, FIG. 5A, and FIG. 5B, the width (y-direction) of the sensor chip 13 is made smaller than the width of the first cutaway part 15c. Accordingly, on the lateral two sides (two sides in the y-direction) of the sensor chip 13, spaces which become a portion of the flow path 3 are formed between the sensor chip 13 and the first layer member 15. Further, the upper surface of the sensor substrate 11 is exposed to the inside of the flow path 3 at these spaces. These spaces become spaces for arrangement of the bonding wires 21 for electrically connecting the sensor chip 13 and the sensor substrate 11.

As shown in FIG. 3, the second cutaway part 17c is narrowed on the two sides in the y-direction of the sensor chip 13. That is, the second layer member 17 has projecting parts 17d projecting to the sensor chip 13 side on the two sides in the y-direction of the sensor chip 13. These projecting parts 17d, from the viewpoint of the height direction (z-direction) of the flow path 3, as shown in FIG. 4A and FIG. 4B, and as seen from a comparison between FIG. 5A and FIG. 5B, become portions which project higher than the upper surface of the first layer member 15 and the upper surface of the sensor chip 13 and reach the lower surface of the third layer member 19. As explained before, in the flow path 3, the bottom face of the upstream side part from the sensor chip 13 is configured by the upper surface of the first layer member 15, therefore the projecting parts 17d become barriers suppressing the flow of the liquid specimen from the upstream side to the downstream side in the flow path 3 on the two sides in the y-direction of the sensor chip 13. The action and effect by these barriers will be explained later.

The positions, shapes, and sizes of the projecting parts 17d may be suitably set. Note, the positions of the projecting parts 17d in the flow direction (x-direction) are preferably determined so that at least portions of the projecting parts 17*d* overlap the range of arrangement of the sensor chip 13 (the range of arrangement in the x-direction overlaps when viewed in the y-direction). Further, in the flow direction, preferably the projecting parts 17*d* are positioned on the upstream side from the center of the sensor chip 13. Further, preferably they are adjacent to the upstream side end part of the sensor chip 13 as illustrated. Further, in FIG. 3, the projecting parts 17*d* are shaped as rectangles in which the length in the flow direction (x-direction) is larger than the width in the direction (y-direction) perpendicular to the flow. However, they may be formed in shapes other than rectangles such as triangles or the width may be larger than the length.

In the flow path 3, the thickness (height, z-direction) is small compared with the length (x-direction) and width (y-direction). Accordingly, in order to suitably cause a capillary action, the upper surface and bottom surface of the flow path 3 preferably have a high wettability (hydrophilicity) with respect to the liquid specimen. Note that, the wettability, as generally known, can be measured in extent according to a contact angle with the liquid specimen (it may be represented by water, same for following description). That is, the higher the wettability, the smaller the contact angle. In the flow path 3, in at least the portion from the inflow port 7 to the sensor chip 13 (including the top of the sensor chip 13), contact angles of the upper surface and bottom surface with the liquid specimen are less than 90°, preferably less than 60°, more preferably less than 10°.

For example, the upper surface of the first layer member 15 and/or the lower surface of the third layer member 19 are hydrophilized. As the first layer member 15 and/or third layer member 19, use may be made of a commercially available resinous film having at least one surface (surface configuring the flow path 3) hydrophilized as well. As the hydrophilization, for example, there can be mentioned a method of arranging (fixing) a coating agent. More specifically, for example, the base material (resinous film) may be ashed by oxygen plasma, may be coated with a silane coupling agent, and may be coated with polyethylene glycol as the coating agent. Further, for example, the base material may be treated on the surface by using a treatment agent having phosphorylcholine, and the coating agent of the phosphorylcholine may be fixed. The resinous film is for example made of a polyester or polyethylene resin.

For the upper surface and bottom surface of the flow path 3 (the upper surface of the first layer member 15 and the lower surface of the third layer member 19), for example the entire surfaces thereof are hydrophilized. Accordingly, the liquid specimen supplied to the inflow port 7 flows along the flow path 3 in a state where it spreads over the entire horizontal cross-section (yz cross-section) of the flow path 3. As a result, for example, in the vicinity of the sensor chip 13, the liquid specimen is filled between the upper surface of the sensor chip 13 and the upper surface of the flow path 3 and between the side surfaces of the sensor chip 13 and the inner wall surfaces 3*w* (FIG. 3, FIG. 5A, and FIG. 5B) of the flow path 3. That is, in the vicinity of the sensor chip 13, the upper surface of the sensor chip 13, bonding wires 21, and the upper surface of the sensor substrate 11 contact the liquid specimen.

Note that, on the upstream side from the sensor chip 13, the inner wall surfaces 3*w* are configured by the inner side surfaces of the cutaway part 17*c* in the second layer member 17 (see FIG. 3). Further, on the downstream side from the lateral sides of the sensor chip 13, the inner wall surfaces 3*w* are configured by the inner side surfaces of the first cutaway part 15*c* in the first layer member 15 and the inner side surfaces of the second cutaway part 17*e* in the second layer member 17.

(Configurations of Electrodes and Wiring)

Figure 6:
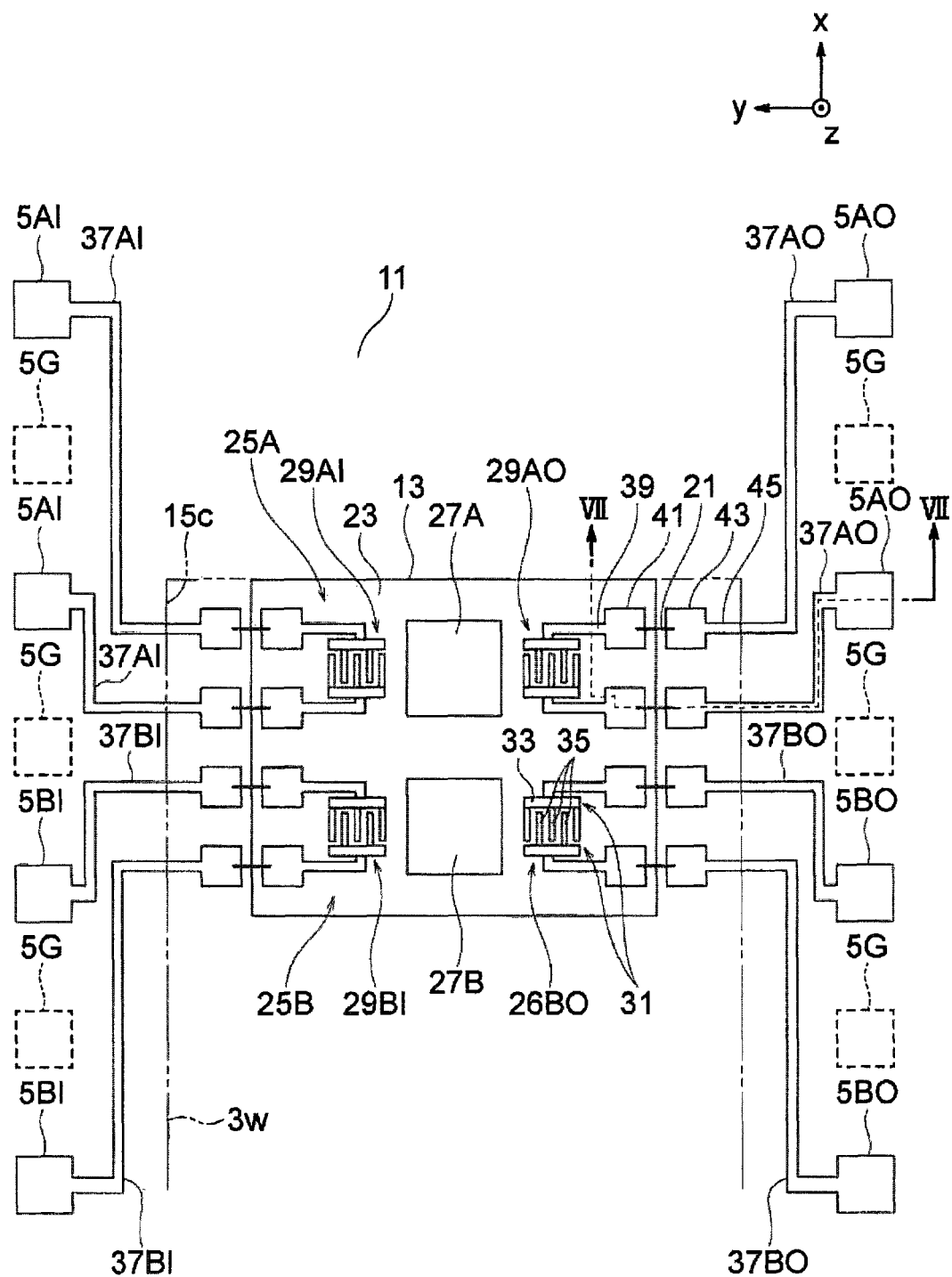
FIG. 6 A plan view showing a chip included in the sensor in FIG. 1 and its periphery.

FIG. 6 is a plan view showing the sensor chip 13 and its periphery. Specifically, this diagram is a top view shown by detaching, the layer members (15, 17, and 19) on the sensor substrate 11 from the sensor 1. Note, the sensor substrate 11 is partially shown (border line is omitted), while the first cutaway part 15*c* in the first layer member 15 is indicated by a two-dot chain line. Note that, the inner side surfaces of the first cutaway part 15*c* configure, in the flow path 3, the inner wall surfaces 3*w* (more strictly speaking, in the inner wall surfaces 3*w*, the portion on the sensor substrate 11 side) of the portion from the lateral sides of the sensor chip 13 to the downstream side.

The sensor chip 13 is for example configured by a SAW (surface acoustic wave) device utilizing a SAW. The sensor chip 13 for example has a piezoelectric substrate 23 and various types of conductors which are provided on the upper surface of the piezoelectric substrate 23. The various types of conductors are for example provided so that one or more of (two in the present embodiment) the sensor parts 25 (the first sensor part 25A and second sensor part 25B) are configured on the piezoelectric substrate 23.

The piezoelectric substrate 23 is for example made of a substrate of a single crystal having piezoelectricity such as a lithium tantalate ($LiTaO_3$) single crystal, lithium niobate ($LiNbO_3$) single crystal, or quartz crystal. The planar shape and various dimensions of the piezoelectric substrate 23 may be suitably set. As an example, the thickness of the piezoelectric substrate 23 is 0.3 mm to 1.0 mm.

The first sensor part 25A and second sensor part 25B for example share the piezoelectric substrate 23 and are given the same configuration except for the detailed parts. The first sensor part 25A has a first metal film 27A and a first input IDT electrode 29AI and a first output IDT electrode 29AO which are arranged sandwiching the first metal film 27A therebetween. In the same way, the second sensor part 25B has a second metal film 27B and a second input IDT electrode 29BI and second output IDT electrode 29BO which are arranged sandwiching the second metal film 27B therebetween.

Note that, in the following description, sometimes the first input IDT electrode 29AI, first output IDT electrode 29AO, second input IDT electrode 29BI, and second output IDT electrode 29BO will be simply referred to as the "IDT electrodes 29" and will not be discriminated. Further, like the "input IDT electrode 29I" and "output IDT electrode 29O", sometimes "first" and "A" and "second" and "B" will be omitted. Further, like the "first IDT electrode 29A" and "second IDT electrode 29B", sometimes "input" and "I" and "output" and "O" will be omitted. This is true also for the configurations concerning the first input IDT electrode 29AI, first output IDT electrode 29AO, second input IDT electrode 29BI, and second output IDT electrode 29BO.

The metal films 27 are for example given substantially rectangular planar shapes and are positioned on the upper surface of the piezoelectric substrate 23 at substantially the center in the y-direction. The metal film 27 for example has a double-layer structure of chromium and gold layered on the chromium. In one of the first metal film 27A and second metal film 27B, an aptamer is arranged (fixed) on the upper surface. An aptamer is not arranged in the other. The aptamer is for example made of a nucleic acid or peptide. Note that, it is also possible to omit the metal film 27.

The input IDT electrodes 29I are ones for receiving electrical signals as input and converting the input electrical signals to a SAW, while the output IDT electrodes 29O are ones for receiving that SAW, converting the received SAW to electrical signals, and outputting the results. That is, the input IDT electrodes 29I and output IDT electrodes 29O are given configurations resembling those of a transversal type SAW filter. In the upper surface of the piezoelectric substrate 23, a region between the input IDT electrodes 29I and the output IDT electrodes 29O becomes a propagation path of the SAW, and the metal films 27 are positioned. The aligning direction (facing direction) of the input IDT electrodes 29I and the output IDT electrodes 29O sandwiching the metal film 27 therebetween is for example a direction crossing the flow path 3 (perpendicular except for manufacturing error).

Note that, between the first sensor part 25A and the second sensor part 25B, the orientations from the input IDT electrodes 29I to the output IDT electrodes 29O may be the same or may be reverse to each other. Preferably, they are the same. Further, for convenience, the IDT electrodes 29 are explained while fixing the input side (transmission side) and the output side (reception side). However, the directions of transmission and reception of the signals with respect to these pair of IDT electrodes 29 may be reversible as well. For example, according to the type of the reader in which the sensor 1 is mounted, the IDT electrode 29 defined as the input side and the IDT electrode 29 defined as the output side may be switched with each other as well.

Each IDT electrode 29 has a pair of comb-shaped electrodes 31. Each comb-shaped electrode 31 for example has a bus bar 33 extending in the propagation direction (y-direction) of the SAW and a plurality of electrode fingers 35 extending from the bus bar 33 in the direction (x-direction) perpendicular to the propagation direction of the SAW. Further, the pair of comb-shaped electrodes 31 are arranged so that the pluralities of electrode fingers 35 mesh with each other.

The frequency characteristics can be designed by using the number of electrode fingers 35 of the IDT electrode 29, the distance between the adjacent electrode fingers 35, the crossing width of the electrode fingers 35, etc. as parameters. As the SAW excited by the IDT electrodes 29, there are a Rayleigh wave, Love wave, leaky wave, and so on. Any may be utilized.

An elastic member for suppressing reflection of the SAW may be provided in a region outside of the pair of IDT electrodes 29 in the propagation direction of the SAW as well. The frequency of the SAW can be set for example within a range from several megahertz (MHz) to several gigahertz (GHz). In this, if the frequency is set to several hundred MHz to 2 GHz, it is practical, and a reduction of size of the piezoelectric substrate 23 and consequently a reduction of size of the sensor chip 13 can be realized.

The IDT electrodes 29 may be configured by for example a suitable metal. As the metal, for example there can be mentioned gold, aluminum, and an alloy of aluminum and copper. These conductors may be given a multilayer structure as well. Where they are given a multilayer structure, for example, the first layer may be formed by titanium or chromium, the second layer may be formed by aluminum or aluminum alloy or gold, and further titanium or chromium may be formed at the uppermost layer.

If the liquid specimen contacts the metal film 27 in which the aptamer is arranged, a specific target substance in the liquid specimen is coupled with the aptamer corresponding to that target substance, so the weight of the metal film 27 changes. As a result, the phase characteristic or the like of the SAW which is propagated from the input IDT electrodes 29I to the output IDT electrodes 29O changes. Accordingly, a property or ingredient of the liquid specimen can be checked based on the change of the phase characteristic etc. Further, in one of the first sensor part 25A and second sensor part 25B, no aptamer is arranged. Therefore, by comparing the phase characteristic of the SAW in the first sensor part 25A and the phase characteristic of the SAW in the second sensor part 25B, for example, error which is common to these two sensor parts 25 can be eliminated.

The comb-shaped electrodes 31 (eight in the present embodiment) are for example connected electrically one-to-one to the external terminals 5 by the connection conductors 37 (37AI, 37AO, 37BI, 37BO). The connection conductors 37 are for example configured by chip lines 39 which extend on the upper surface of the piezoelectric substrate 23 from the bus bars 33 of the comb-shaped electrodes 31, chip terminals 41 positioned on the front ends of the chip lines 39, the already explained bonding wires 21 having single ends joined to the chip terminals 41, substrate pads 43 which are positioned on the upper surface of the sensor substrate 11 and are joined to the other ends of the bonding wires 21, and substrate lines 45 which extend on the upper surface of the sensor substrate 11 from the substrate pads 43 to the external terminals 5.

The sum of the line lengths of the total four first connection conductors 37A connected to the pair of first IDT electrodes 29A and the sum of the line lengths of the total four second connection conductors 37B connected to the pair of second IDT electrodes 29B are made equal to each other. Further, the total four first connection conductors 37A and the total four second connection conductors 37B are made equal to each other also in the sums of the line lengths in the flow path 3. As a result, the total four first connection conductors 37A and the total four second connection conductors 37B are made equal to each other also in the sums of the electric lengths.

Note that, the "line length" is for example a physical length (actual length) of the center line of a line (conductor). On the other hand, the "electric length" is a length based on the wavelength of a signal propagated through the line (conductor). For example, if signals having the same phase are input to two lines having electric lengths equal to each other, the phases of the signals output from these two lines are equal to each other. Further, the electric length becomes longer when the permittivity concerning the propagation path of the signal becomes higher. For example, when there is water (relative permittivity: about 50) around the line, compared with a case where there is air (relative permittivity: about 1) around the line, the electric length becomes longer. Accordingly, in a connection conductor 37, if the liquid specimen is filled in the flow path 3, the electric length changes (becomes longer). The relative permittivity of a resin is generally higher than that of air and lower than that of water although depending on its composition and molecular structure.

The four first connection conductors 37A and the four second connection conductors 37B are, over the whole from the IDT electrodes 29 to the external terminals 5, given symmetrical shapes relative to a not shown axis of symmetry passing through the middle between the pair of first IDT electrodes 29A and the pair of second IDT electrodes 29B and extending in the y-direction. Due to this, the sums of the line lengths are made equal to each other. The concrete configurations of the portions of the connection conductors 37 are for example as follows.

The chip lines 39 are layered conductors. For example, they are made of the same material as that for the comb-shaped electrodes 31. The two chip lines 39 connected to each IDT electrode 29 are for example given a line-symmetric shape relative to an axis of symmetry which passes through the center of the IDT electrode 29 and extends in the y-direction. For example, the two chip lines 39 connected to each IDT electrode 29 are given shapes extending a little to the sides opposite to each other in the x-direction from the pair of bus bars 33 of the IDT electrode 29, and then bending and extending to the same side in the y-direction. Further, the total four chip lines 39 connected to each sensor part 25 are given line-symmetric shapes relative to a not shown axis of symmetry which passes through the center of the sensor part 25 and extends in the x-direction. Further, the total eight chip lines 39 connected to the two sensor parts 25 are given line-symmetric shapes relative to a not shown axis of symmetry which passes through an intermediate position of the two sensor parts 25 and is parallel to the y-direction. Accordingly, when ignoring an error in patterning etc., the eight chip lines 39 are equal to each other in line length. Further, all of the eight chip lines 39 are wholly exposed in the flow path 3, the permittivities around them are equal to each other, and consequently the electric lengths are equal to each other at both of the times before and after filling of the liquid specimen in the flow path 3.

The chip terminals 41 are layered conductors and are made of for example the same material as that for the chip lines 39 or are configured by superimposing another material on the upper surface of the former material. Note that, the chip terminals 41 may be formed with the same widths as those of the chip lines 39 and be only single ends of the chip lines 39 as well. The total eight chip terminals 41 are for example given shapes the same as each other. Accordingly, when ignoring errors of patterning and connection positions of the bonding wires 21 and so on, the line lengths of the total eight chip terminals 41 are equal to each other. Further, all of the eight chip terminals 41 are wholly exposed in the flow path 3, the permittivities around them are equal to each other, and consequently the electric lengths are equal to each other at both of the times before and after filling of the liquid specimen in the flow path 3.

The bonding wires 21 are conductors of wire-shaped materials and are made of for example gold or another suitable metal. The eight bonding wires 21 in total are for example given the same shapes three-dimensionally as each other. Accordingly, when ignoring an error at the time of formation, the line lengths of the eight bonding wires 21 are equal to each other. Further, in all of the eight bonding wires 21, the wires are wholly exposed in the flow path 3, the permittivities around them are equal to each other, and consequently the electric lengths are equal to each other at both of the times before and after filling of the liquid specimen in the flow path 3.

The substrate pads 43 are layered conductors and are made of for example the same material as that for the substrate lines 45 or are configured by superimposing another material on the former material. Note that, the substrate pads 43 may be formed with the same widths as that of the substrate lines 45 and be only single ends of the substrate lines 45 as well. The total eight substrate pads 43 are for example given shapes the same as each other. Accordingly, when ignoring errors of patterning and connection positions of the bonding wires 21 and so on, the line lengths of the total eight substrate pads 43 are equal to each other. Further, all of the substrate pads 43 are wholly exposed in the flow path 3, the permittivities around them are equal to each other, and consequently the electric lengths are equal to each other at both of the times before and after filling of the liquid specimen in the flow path 3.

Note that, the chip terminals 41 and the substrate pads 43 are for example arranged parallel to each other at the same pitches as each other. Due to this, the distances between the chip terminals 41 and the substrate pads 43 become equal among the plurality of chip terminals 41 and substrate pads 43. As a result, in each column, the bonding wires 21 have shapes (lengths) equal to each other.

Further, in the connection conductors 37, in the portions from the chip lines 39 to the substrate pads 43, the line lengths are the same as each other among the eight connection conductors 37. Further, in the portions from the chip lines 39 to the substrate pads 43 in the line conductors 37, the line lengths are the same as each other and the portions are wholly exposed in the flow path 3, therefore also the electric lengths are equal to each other among the eight connection conductors 37.

The substrate lines 45 are layered conductors and are for example made of copper or another metal. The total four substrate lines 45 connected to each sensor part 25 are given line-symmetric shapes relative to a not shown axis of symmetry which passes through the center of each sensor part 25 and extends in the x-direction. Further, the total eight substrate lines 45 connected to the two sensor parts 25 are given line-symmetric shapes relative to a not shown axis of symmetry which passes through an intermediate position between the two sensor parts 25 and extends in the y-direction.

Accordingly, for example, the sum of line lengths of the four substrate lines 45 in the first connection conductors 37A and the sum of the line lengths of the four substrate lines 45 in the second connection conductors 37B are equal to each other. Further, for example, the sum of line lengths of the two substrate lines 45 in the first input connection conductors 37AI and the sum of line lengths of the two substrate lines 45 in the second input connection conductors 37BI are equal to each other. Further, for example, the sum of line lengths of the two substrate lines 45 in the first output connection conductors 37AO and the sum of line lengths of the two substrate lines 45 in the second output connection conductors 37BO are equal to each other. Further, for example, in each sensor part 25, the sum of line lengths of the two substrate lines 45 in the input connection conductors 37I and the sum of line lengths of the two substrate lines 45 in the output connection conductors 37O are equal to each other.

The substrate lines 45 are for example given shapes that extend from the substrate pads 43 parallel to the y-direction (in more detail, to the inner wall surface 3w side) and then bend and extend parallel to the x-direction (in more detail, outside of the alignment direction of the plurality of external terminals 5). By the substrate lines 45 bending and extending in the x-direction, the plurality of substrate pads 43 and the plurality of external terminals 5 (5AI, 5AO, 5BI, and 5BO) which are arranged at a larger pitch than the pitch of the plurality of substrate pads 43 are connected. In the substrate lines 45, the portions which extend from the substrate pads 43 in the y-direction are formed relatively long. Consequently, the bent parts of the substrate lines 45 are positioned outside of the flow path 3. Due to this, as will be explained in detail later, for example, between the two sensor parts 25, not only sums of the line lengths of the substrate lines 45, but also sums of the electric lengths become easy to be made equal to each other.

As shown in FIG. 1 and FIG. 6, as the external terminals 5 in the columns, for example, the external terminals 5 (5AI, 5AO 5BI and 5BO) connected to the comb-shaped electrodes 31 and reference potential-use external terminals 5G connected to the reference potential part are alternately arranged. Due to this, interference between the external terminals 5 to/from which the signals are input/output is suppressed.

Figure 7:
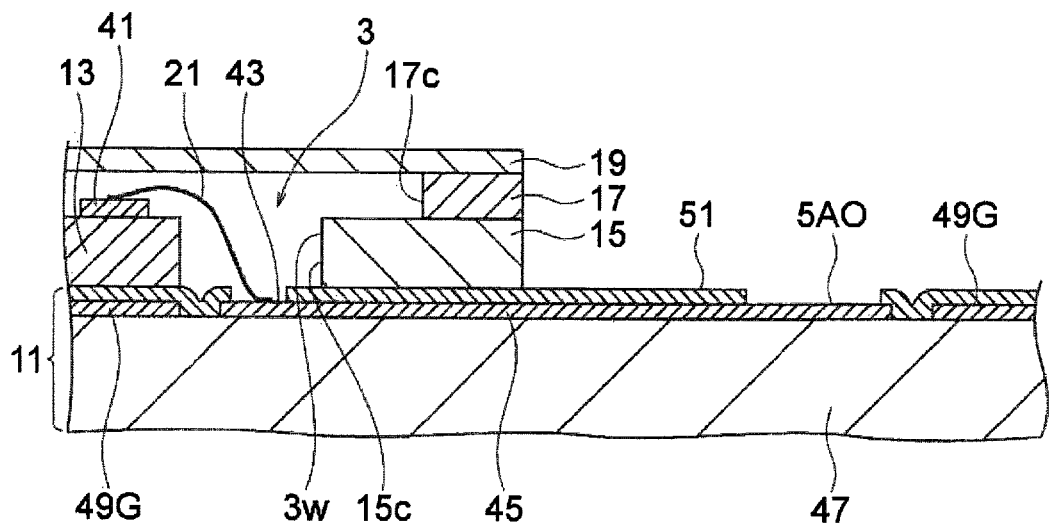
FIG. 7 A cross-sectional view taken along a line VII-VII in FIG. 6.

FIG. 7 is a cross-sectional view taken along the line VII-VII in FIG. 6.

The sensor substrate 11 for example has an insulating substrate 47, a conductive layer (substrate lines 45 etc.) arranged on the upper surface of the insulation substrate 47, and a solder resist 51 which covers the conductive layers except for certain portions.

In the conductive layer including the substrate lines 45, the portions covered by the solder resist 51 substantially become the substrate lines 45, and the end parts exposed from the solder resist 51 become the substrate pads 43 or external terminals 5 (5AO, 5AI, 5BO, and 5BI). In most of the parts excluding this signal-use conductive layer, reference potential patterns 49G given the reference potential by a not shown reader are provided. The portions in the reference potential pattern 49G which are exposed from the solder resist 51 configure the reference potential-use external terminals 5G.

As shown in this figure, the substrate lines 45 are covered by the solder resist 51, so do not directly contact the liquid specimen even in the portions positioned in the flow path 3. Note, the solder resist 51 is relatively thin. Therefore, if the flow path 3 is filled with the liquid specimen, the electric lengths of the substrate lines 45 change (generally become longer) compared with those before filling. In the same way, sometimes the IDT electrodes 29 and chip lines 39 are covered by a not shown protective layer (insulation film). However, the thickness of the protective layer is relatively thin. Therefore, if the flow path 3 is filled with the liquid specimen, the electric lengths change (generally become longer) compared with those before filling. Note that, the solder resist 51 may be omitted as well.

FIG. 8A to FIG. 8C are schematic views for explaining the mode of operation according to the shapes etc. of the substrate lines 45.

As already explained, in the substrate lines 45, the portions which extend linearly (parallel to the y-direction) from the substrate pads 43 to the outside of the flow path 3 are formed relatively long, while the bent parts of the substrate lines 45 are spaced relatively apart from the flow path 3. Accordingly, even if the position of the flow path 3 is offset relative to the substrate lines 45, the portions in the substrate lines 45 which are positioned in the flow path 3 are the linear portions extending in the y-direction as they are. As a result, as in the following description, the change of the sums of line lengths in the flow path 3 is reduced, and consequently the change of the sums of the electric lengths is reduced.

FIG. 8A shows a case where a first layer member 15 is ideally adhered to the sensor substrate 11. That is, the not shown axis of symmetry of the total eight substrate lines 45 which extend in the x-direction and the not shown center line of the flow path 3 coincide.

In this state, among the total eight substrate lines 45, the lengths of the lines positioned in the flow path 3 are equal to each other (the line lengths $a_1$ to $a_4$ and $b_1$ to $b_4$ are equal to each other) and consequently the electric lengths are equal to each other in the flow path 3. Accordingly, for example, among the substrate lines 45 having the line lengths equal to each other over the whole of the inside and outside of the flow path 3, the electric lengths are equal to each other even considering both of the inside and outside of the flow path 3.

For the same reason, the sum of the electric lengths of the four substrate lines 45 in the first connection conductors 37A and the sum of the electric lengths of the four substrate lines 45 in the second connection conductors 37B are equal. The sum of the electric lengths of the two substrate lines 45 in the first input connection conductors 37AI and the sum of the electric lengths of the two substrate lines 45 in the second input connection conductors 37BI are equal. The sum of the electric lengths of the two substrate lines 45 in the first output connection conductors 37AO and the sum of the electric lengths of the two substrate lines 45 in the second output connection conductors 37BO are equal. In each sensor part 25, the sum of the electric lengths of the two substrate lines 45 in the input connection conductors 37I and the sum of the electric lengths of the two substrate lines 45 in the output connection conductors 37O are equal.

On the other hand, unlike the present embodiment, if, for example, only one of the two sensor parts 25 has the bent parts of the substrate lines 45 positioned in the flow path 3 or the like and therefore the line lengths in the flow path 3 of the substrate lines 45 are different from each other between the two sensor parts 25, the line lengths having the permittivities raised by the liquid specimen end up being different from each other between the two sensor parts 25. As a result, a phase difference caused by the change of the permittivities in the bent parts of the substrate lines 45 is included in the phase difference between the two sensor parts 25, therefore the detection accuracy falls.

FIG. 8B shows a case where the first layer member 15 is adhered with offset in the y-direction with respect to the sensor substrate 11. That is, the not shown axis of symmetry extending in the x-direction of the total eight substrate lines 45 and the not shown center line of the flow path 3 are offset in parallel.

Even in this state, between the two sensor parts 25, the sums of the line lengths of the portions in the substrate lines 45 which are positioned in the flow path 3 are equal. That is, $a_1'+a_2'+a_3'+a_4'$ and $b_1'+b_2'+b_3'+b_4'$ are equal. Consequently, between the two sensor parts 25, the sums of the electric lengths of the portions in the substrate lines 45 which are positioned in the flow path 3 are equal. Accordingly, even considering both of the inside and outside of the flow path 3, the sum of the electric lengths of the four substrate lines 45 in the first connection conductor 37A and the sum of the electric lengths of the four substrate lines 45 in the second connection conductors 37B are still equal.

Further, in the same way, $a_1'+a_3'=b_1'+b_3'$, therefore the sum of the electric lengths of the two substrate lines 45 in the first input connection conductors 37AI and the sum of the electric lengths of the two substrate lines 45 in the second input connection conductors 37BI are equal. Since $a_2'+a_4'=b_2'+b_4'$, the sum of the electric lengths of the two substrate lines 45 in the first output connection conductors 37AO and the sum of the electric lengths of the two substrate lines 45 in the second output connection conductors 37BO are equal.

On the other hand, unlike the present embodiment, for example, if the first layer member 15 is adhered with offset in the y-direction and therefore the bent parts of the substrate lines 45 are positioned in the flow path 3 in only one of the two sensor parts 25, the substrate lines 45 in this one sensor part 25 becomes longer in line length having the permittivity raised by the liquid specimen compared with the substrate lines 45 in the other sensor part 25. As a result, the phase difference between the two sensor parts 25 ends up including the phase difference caused by the change of the permittivity in the bent parts of the substrate lines 45, therefore the detection accuracy falls.

FIG. 8C shows a case where the first layer member 15 is adhered with offset about the z-axis with respect to the sensor substrate 11. That is, the not shown axis of symmetry of the total eight substrate lines 45 which extends in the x-direction and the not shown center line of the flow path 3 are inclined.

Even in this state, between the two sensor parts 25, the sums of the line lengths of the portions of the substrate lines 45 which are positioned in the flow path 3 are equal. That is, $a_1''+a_2''+a_3''+a_4''$ and $b_1''+b_2''+b_3''+b_4''$ are equal. Accordingly, even considering both of the inside and outside of the flow path 3, the sum of the electric lengths of the four substrate lines 45 in the first connection conductors 37A and the sum of the electric lengths of the four substrate lines 45 in the second connection conductors 37B are still equal.

On the other hand, unlike the present embodiment, for example, if the first layer member 15 is adhered with an offset around the z-axis and therefore only one of the two sensor parts 25 has bent parts of the substrate lines 45 positioned in the flow path 3, the substrate lines 45 of this one sensor part 25 become longer in line lengths where the permittivity becomes higher due to the liquid specimen compared with the substrate lines 45 in the other sensor part 25. As a result, the phase difference between the two sensor parts 25 ends up including the phase difference caused by the change of the permittivity in the bent parts of the substrate lines 45, therefore the detection accuracy falls.

Further, among FIG. 8A to FIG. 8C, the sums of the electric lengths of the substrate lines 45 are constant. For example, in the flow path 3, $a_1+a_2+a_3+a_4$, $a_1'+a_2'+a_3'+a_4'$, and $a_1''+a_2''+a_3''+a_4''$ are the same as each other. Consequently, even when considering both of the inside and outside of the flow path 3, the sums of the electric lengths of the substrate lines 45 are equal. According to this as well, for example, the error is reduced in the case of comparing the phase differences among the plurality of sensors 1, therefore the detection accuracy is improved.

(Measurement Method Using Liquid Specimen Sensor)

In the measurement method of the liquid specimen using the sensor 1, first, the liquid specimen is supplied to the inflow port 7. At this time, the liquid specimen is supplied in an amount large enough to fill the liquid specimen up to at least the sensor chip 13 in the flow path 3. The liquid specimen supplied to the inflow port 7 is guided to the upper surface of the sensor chip 13 due to capillary action. The upper surface of the flow path 3 is hydrophilized over its entire width, therefore the liquid specimen contacts not only the metal films 27, but also the entire portions in the IDT electrodes 29 and connection conductors 37 which are positioned in the flow path 3.

Next, the sensor 1 is mounted in a not shown reader. Note that, the liquid specimen may be supplied to the inflow port 7 in a state where the sensor 1 is mounted in the reader as well.

After that, for example, the reader inputs a signal in parallel (inputs signals having the same phase) to the first input external terminal 5AI and second input external terminal 5BI. Further, the reader receives a signal output from the first output external terminal 5AO and a signal output from the second output external terminal 5BO and identifies a phase difference between the two signals. Based on the magnitude of that phase difference, an ingredient of the liquid specimen is identified.

Note that, for example, it is also possible to identify a phase difference between the signal input to the input external terminal 5I and the signal received from the output external terminal 5O and identify an ingredient of the liquid specimen based on the magnitude of that phase difference. Further, for example, it is possible to identify the phase difference between the signal input to the input external terminal 5I and the signal received from the output external terminal 5O, compare the phase differences between the first sensor part 25A and the second sensor part 25B, and identify an ingredient of the liquid specimen based on the magnitude of a difference between the phase differences.

As described above, in the present embodiment, the liquid specimen sensor 1 is provided with a pair of first IDT electrodes 29A and a pair of second IDT electrodes 29B having at least parts positioned in the flow path, a pair of first input connection conductors 37AI connected to one of the pair of first IDT electrodes 29A and extending to the outside of the flow path 3, a pair of first output connection conductors 37AO connected to the other of the pair of first IDT electrodes 29A and extending to the outside of the flow path 3, a pair of second input connection conductors 37BI connected to one of the pair of second IDT electrodes 29B and extending to the outside of the flow path 3, and a pair of second output connection conductors 37BO connected to the other of the pair of second IDT electrodes 29B and extending to the outside of the flow path 3. The sum of the line lengths $(a_1+a_2+a_3+a_4)$ in the flow path 3 of the pair of first input connection conductors 37AI and the pair of first output connection conductors 37AO and the sum of the line lengths $(b_1+b_2+b_3+b_4)$ in the flow path 3 of the pair of second input connection conductors 37BI and the pair of second output connection conductors 37BO are equal (for example, FIG. 8A to FIG. 8C).

Accordingly, unlike the past that covers were provided to isolate the flow path from the IDT electrodes and connection conductors or a hydrophilic region was used to substantially arrange the IDT electrodes and connection conductors outside of the flow path, the liquid specimen is made flow to around the IDT electrodes and connection conductors and, further, the electric lengths of the connection conductors 37 are made equal (easily made equal) to each other between the two sensor parts 25. As a result of such a reversal in thinking, the influence of the liquid specimen exerted upon the detection accuracy is reduced with a simple configuration.

Further, in the present embodiment, the sum of the line lengths $(a_1+a_3)$ in the flow path 3 of the pair of first input connection conductors 37AI and the sum of the line lengths $(b_1+b_3)$ in the flow path 3 of the pair of second input connection conductors 3731 are equal, and the sum of the line lengths $(a_2+a_4)$ in the flow path 3 of the pair of first output connection conductors 37AO and the sum of the line lengths $(b_2+b_4)$ in the flow path 3 of the pair of second output connection conductors 37BO are equal (for example FIG. 8A or FIG. 8B).

Accordingly, between the two sensor parts 25, it is easy to make the sums of the electric lengths concerned with the input IDT electrodes 29I equal. Further, between the two sensor parts 25, it is easy to make the sums of the electric lengths concerned with the output IDT electrodes 29O equal. As a result, for example, the SAW will be propagated with the same phase between the two sensor parts 25, therefore the liability of a drop in the detection accuracy due to the interference of SAWs between the two sensor parts 25 is reduced.

Further, in the present embodiment, the sum of the line lengths ($a_1+a_3$) in the flow path 3 of the pair of first input connection conductors 37AI and the sum of the line lengths ($a_2+a_4$) in the flow path of the pair of first output connection conductors 37AO are equal, and the sum of the line lengths ($b_1+b_3$) in the flow path 3 of the pair of second input connection conductors 37BI and the sum of the line lengths ($b_2+b_4$) in the flow path of the pair of second output connection conductors 37BO are equal (for example FIG. 8A). The line lengths in the flow path 3 are equal to each other ($a_1=a_3$) in the pair of first input connection conductors 37AI, the line lengths in the flow path 3 are equal to each other ($a_2=a_4$) in the pair of first output connection conductors 37AO, the line lengths in the flow path 3 are equal to each other ($b_1=b_3$) in the pair of second input connection conductors 37BI, and the line lengths in the flow path 3 are equal to each other ($b_2=b_4$) in the pair of second output connection conductors 37BO.

In this way, by making the line lengths in the flow path 3 equal for as many connection conductors 37 as possible and consequently making it easier for the electric lengths to be made equal, unintended phase delay or noise due to the liquid specimen is suppressed, therefore the detection accuracy can be improved.

Further, in the present embodiment, the liquid specimen sensor 1 has a sensor substrate 11 on the upper surface which the flow path 3 is positioned and a sensor chip 13. The sensor chip 13 has a piezoelectric substrate 23 positioned on the sensor substrate 11 and a pair of first IDT electrodes 29A and a pair of second IDT electrodes 29B positioned on the upper surface of the piezoelectric substrate 23. Each of the eight of the conductors of the pair of first input connection conductors 37AI, the pair of first output connection conductors 37AO, the pair of second input connection conductors 37BI, and the pair of second output connection conductors 37BO includes a bonding wire 21 which extends from the upper surface of the sensor chip 13 to the upper surface of the sensor substrate 11 and is wholly positioned in the flow path 3. The sum of the line lengths of the bonding wires 21 of the pair of first input connection conductors 37AI and the pair of first output connection conductors 37AO and the sum of the line lengths of the bonding wires 21 of the pair of second input connection conductors 37BI and the pair of second output connection conductors 37BO are equal.

Accordingly, for example, in the flow path 3, space for arrangement of the bonding wires 21 is secured. As a result, it is not necessary to provide a cover etc. Further, the bonding wires 21 and the IDT electrodes 29 can be made to approach. That is, simplification and reduction of size of the liquid specimen sensor 1 are achieved. Further, the sum of the electric lengths of the bonding wires 21 of the pair of first input connection conductors 37AI and the pair of first output connection conductors 37AO and the sum of the electric lengths of the bonding wires 21 of the pair of second input connection conductors 37BI and the pair of second output connection conductors 37BO are equal. Therefore, in the connection conductors 37 from the IDT electrodes 29 to the external terminals 5 as a whole, making the sum of the electric lengths of the pair of first input connection conductors 37AI and the pair of first output connection conductors 37AO and the sum of the electric lengths of the pair of second input connection conductors 37BI and the pair of second output connection conductors 37BO equal becomes easier.

Further, in the present embodiment, the eight bonding wires 21 are equal to each other in line lengths. Accordingly, for example, just by arranging the chip terminals 41 and substrate pads 43 which are connected to the two ends of the bonding wires 21 at the same pitch and making the entire bonding wires 21 positioned in the flow path 3, the sum of the electric lengths of the bonding wires 21 of the pair of first input connection conductors 37AI and the pair of first output connection conductors 37AO and the sum of the electric lengths of the bonding wires 21 of the pair of second input connection conductors 37BI and the pair of second output connection conductors 37BO can be made equal, therefore the design is easy.

Further, in the present embodiment, each of the eight conductors of the pair of first input connection conductors 37AI, the pair of first output connection conductors 37AO, the pair of second input connection conductors 37BI, and the pair of second output connection conductors 37BO includes a substrate line 45 as a layered conductor which extends on the upper surface of the sensor substrate 11, has one end positioned in the flow path 3, and has the other end positioned outside of the flow path 3. The sum of the line lengths in the flow path 3 of the substrate lines 45 in the pair of first input connection conductors 37AI and the pair of first output connection conductors 37AO and the sum of the line lengths in the flow path 3 of the substrate lines 45 in the pair of second input connection conductors 37BI and the pair of second output connection conductors 37BO are equal.

Accordingly, the sensor chip 13 and the external terminals 5 can be connected by utilizing the substrate lines 45 formed on the major surface of the sensor substrate 11. As a result, compared with the aspect of arranging the lines inside the sensor substrate 11 (this aspect is also included in the invention of the present application, see FIG. 10), the configuration of the sensor substrate 11 is simpler. For example, as the sensor substrate 11, use can be made of a single layer substrate having conductors formed only on one major surface.

Further, in the present embodiment, among the eight substrate lines 45, the line lengths in the flow path 3 are equal to each other. Accordingly, for example, it is possible to easily make the sum of the electric lengths of the substrate lines 45 in the pair of first input connection conductors 37AI and the pair of first output connection conductors 37AO and the sum of the electric lengths of the substrate lines 45 in the pair of second input connection conductors 37BI and the pair of second output connection conductors 37BO equal.

Further, in the present embodiment, the liquid specimen sensor 1 has a pair of inner wall surfaces 3w arranged on the sensor substrate 11, facing each other, and configuring the side surfaces of the flow path 3. The pair of first IDT electrodes 29A and the pair of second IDT electrodes 29B are arranged in a first direction (x-direction) crossing the facing direction of the pair of inner wall surfaces 3w. The pair of first IDT electrodes 29A face each other in the second direction (y-direction) perpendicular to the x-direction. The pair of second IDT electrodes 29B face each other in the y-direction. The substrate lines 45 in the pair of first input connection conductors 37AI are connected to the single ends positioned in the flow path 3 and extend in parallel in the y-direction up to one of the pair of inner wall surfaces 3w (inner wall surface 3w on the positive side in the y-direction). The substrate lines 45 in the pair of first output connection conductors 37AO are connected to the single ends positioned in the flow path 3 and extend in parallel to the y-direction up to the other of the pair of inner wall surfaces 3w (inner wall surface 3w on the negative side in the y-direction). The substrate lines 45 in the pair of second input connection conductors 37BI are connected to the single ends positioned in the flow path 3 and extend in parallel to the y-direction up to one of the pair of inner wall surfaces 3w (inner wall surface 3w on the positive side in the y-direction). The substrate lines 45 in the pair of second output connection conductors 37BO are connected to the single ends positioned in the flow path 3 and extend in parallel to the y-direction up to the other of the pair of inner wall surfaces 3w (inner wall surface 3w on the negative side in the y-direction).

Accordingly, as explained with reference to FIG. 8A to FIG. 8C, even if the member configuring the inner wall surfaces 3w (the first layer member 15 in the present embodiment) is offset relative to the sensor substrate 11, in the flow path 3, it is possible to make the sum of the line lengths of the substrate lines 45 in the pair of first input connection conductors 37AI and the pair of first output connection conductors 37AO and the sum of the line lengths of the substrate lines 45 in the pair of second input connection conductors 37BI and the pair of second output connection conductors 37BO equal. As a result, even if the first layer member 15 is offset, it is easy to make the sums of the electric lengths equal between the first sensor part 25A and the second sensor part 25B. Consequently, the detection accuracy becomes stable.

Further, in the present embodiment, the liquid specimen sensor 1 is further provided with a sensor chip 13 which is positioned on the bottom face of the flow path 3 and has the pair of first IDT electrodes 29A and the pair of second IDT electrodes 29B on its upper surface; and one pair of barriers (projecting parts 17d) located at two positions in the direction (y-direction) perpendicular to the flow direction in the flow path 3, sandwiching the sensor chip 13 therebetween, and projecting upward relative to the bottom face of the flow path 3 (the upper surface of the first layer member 15) on the upstream side of the sensor chip.

Accordingly, for example, the liability of the liquid specimen ending up flowing downstream of the sensor chip 13 along the inner wall surfaces 3w before it flows on the upper surface of the sensor chip 13 is reduced. As a result, the liability of formation of gas bubbles on the upper surface of the sensor chip 13 is reduced, therefore the liquid specimen reliably contacts the upper surface of the sensor chip 13. Consequently, the detection accuracy is improved (becomes stable). When such a pair of barriers (projecting parts 17d) project toward the upper part relative to the upper surface of the sensor chip 11 and when the upper end part of the pair of barriers reaches the upper surface of the flow path 3 (the lower surface of the third layer member 19), the effect of suppressing the flow on the inner wall surfaces 3w side becomes high, therefore the detection accuracy becomes stable.

Note that, in the above embodiment, the first input connection conductors 37AI are one example of the first input conductor, the first output connection conductors 37AO are one example of the first output conductor, the second input connection conductors 37BI are one example of the second input conductor, and the second output connection conductors 37BO are one example of the second output conductor.

Second Embodiment

Figure 9A:
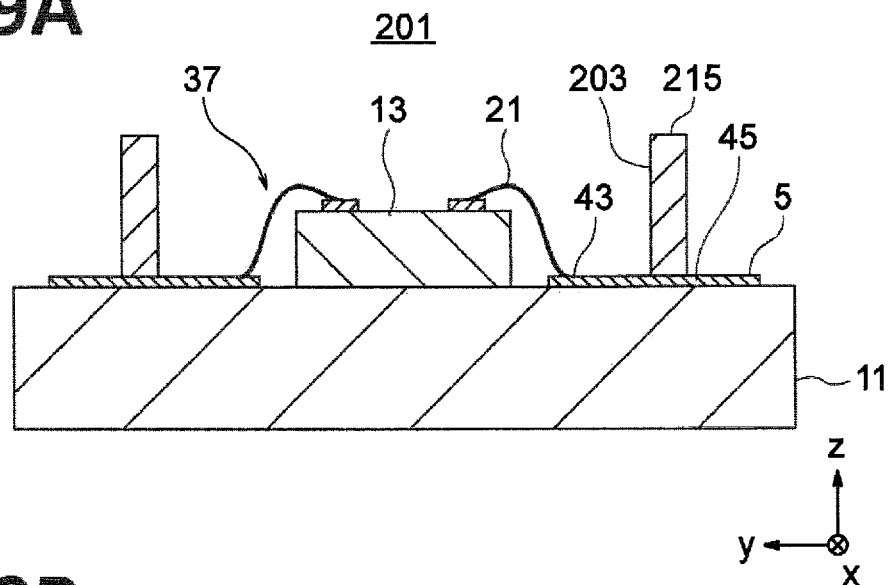
FIG. 9A is a cross-sectional view showing a sensor according to a second embodiment of the present invention.
Figure 9B:
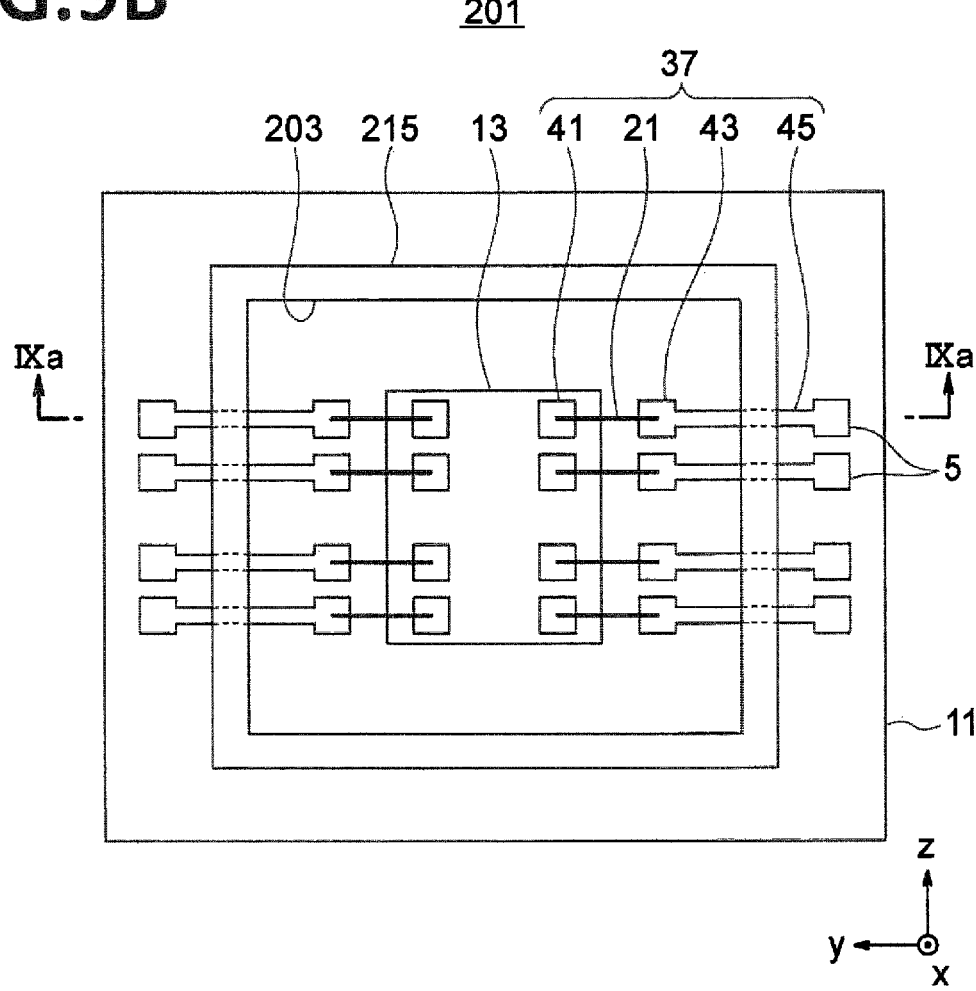
FIG. 9B is a plan view of the sensor in FIG. 9A.

FIG. 9A is a cross-sectional view showing a liquid specimen sensor 201 according to a second embodiment, and FIG. 9B is a plan view of the sensor 201. Note that, FIG. 9A is a cross-sectional view taken along the line IXa-IXa in FIG. 9B.

The sensor 201 in the second embodiment, compared with the sensor 1 in the first embodiment, differs mainly in the configuration of the flow path. Specifically, a flow path 203 in the sensor 201 is configured by a wall part 215 formed in a frame shape on the sensor substrate 11, and the upper part is opened. When supplying the liquid specimen to the flow path 203, for example, the liquid specimen is dropped from the upper part by a Pasteur pipette or the like. At this time, for example, the liquid specimen is supplied in an amount large enough to spread over the entire flow path 203.

Note that, the IDT electrodes 29 (illustration omitted in FIG. 9) and the connection conductors 37 are arranged in the flow path 203 and are immersed in the liquid specimen, and the electric lengths are made equal among the eight connection conductors 37 at this time, in the same way as the above embodiment.

Third Embodiment

Figure 10:
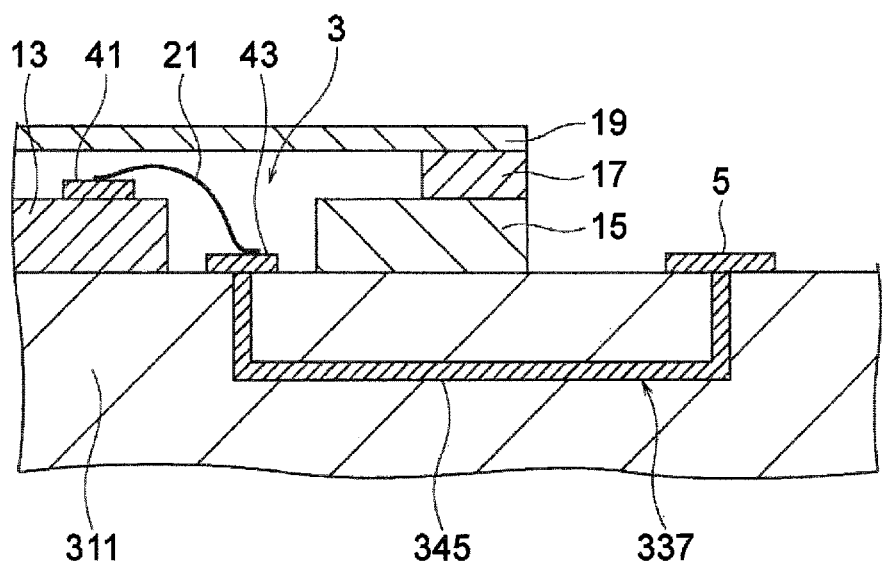
FIG. 10 A cross-sectional view showing a portion of a sensor according to a third embodiment of the present invention.

FIG. 10 is a cross-sectional view showing a portion of a liquid specimen sensor 301 according to a third embodiment.

In the liquid specimen sensor 302, substrate lines 345 are provided not on a major surface of a sensor substrate 311, but inside it, and connects the substrate pad 43 and the external terminals 5. In such a configuration, for example, if the line lengths of the bonding wires 21 are made substantially constant, the electric lengths of the connection conductors 337 from the IDT electrodes 29 (not shown in FIG. 10) to the external terminals 5 can be made constant. As a result, it is easy to make the electric lengths equal among a plurality of connection conductors 337.

The present invention is not limited to the above embodiments or modification and may be executed in various ways.

It does not matter for what application the sensor used for. In other words, the type of the specimen (liquid specimen) may be any type. For example, the type of specimen may be a bodily fluid (for example blood), may be a beverage, may be a liquid medicine, or may be water which is not pure water (for example sea water, lake water, ground water). Further, for example, the type of specimen may be one containing water or may be one containing oil. Further, for example, the type of specimen may be a solution or sol.

The shape of the flow path may be modified in various ways. For example, in the first embodiment, the two side portions of the first cutaway part 15c in the first layer member 15 need not configure the bottom face of the flow path downstream from the projecting parts 17d. Further, the first layer member 15 may be formed with a hole at the position of arrangement of the sensor chip 13 in place of the first cutaway part 15c and may configure the entire bottom surface of the portion of the flow path located downstream from the sensor chip 13. Further, the flow path may be suitably branched or bent.

Further, when the characterizing feature resides in that the four layered conductors (substrate lines 45) connected to the pair of IDT electrodes linearly extend in parallel to the y-direction in the flow path, the sensor is not limited to one having two or more sensor parts (two pairs of IDT electrodes) and may be one having only one sensor part as well. In this case as well, the change of electric length caused by the positional offset of the flow path is reduced. As a result, for example, the unintended phase difference between the signal input to the input external terminal and the signal output from the output external terminal is reduced, therefore the detection accuracy is improved. Further, for example, unintended phase difference among a plurality of sensors is reduced, therefore the detection accuracy is improved.

In all or any of the plurality of connection conductors, an inductor or other element having a relatively large influence upon the phase may be arranged in the middle. In this case as, for example, by the line lengths in the flow path of the plurality of connection conductors being made equal to each other, the effect is exerted that adjustment of the electric length of an entire connection conductor among the plurality of connection conductors is easy. Further, the plurality of connection conductors need not be made equal to each other in their phases and may be set so that the phases are offset with a predetermined magnitude as well.

When saying that the line lengths are equal to each other, they do not have to be completely the same as each other. An error to a certain extent may be included as well. As the error, for example, there can be mentioned an error caused in the manufacturing process. Further, for example, there can be mentioned an error permitted based on the detection accuracy demanded from each liquid specimen sensor. As an example, an error of length of about 5% is sometimes permitted as well.

As an embodiment of a sensor according to the present invention, the following configuration can be extracted.

A liquid specimen sensor includes a flow path, a sensor chip which is located on a bottom face of the flow path and includes excitation electrodes on its upper surface facing the upper surface of the flow path with a clearance therebetween, and a pair of barriers on the lateral two sides of the sensor chip relative to the flow direction of the flow path which project to the upper part from the bottom face of the flow path on the upstream side of the sensor chip.

In this configuration, the connection conductors need not be positioned in the flow path, and the plurality of electric lengths need not be constant. Further, the excitation electrode is not limited to one measuring a liquid specimen based on the phase (one comprised of a pair of IDT electrodes) and may be a variety of electrodes.

REFERENCE SIGNS LIST

1 . . . sensor, 29A . . . first IDT electrode, 29B . . . second IDT electrode, 37A . . . first input connection conductor (first input conductor), 37AO . . . first output connection conductor (first output conductor), 37BI . . . second input connection conductor (second input conductor), and 37BO . . . second output connection conductor (second output conductor).

The invention claimed is:

1. A liquid specimen sensor, comprising:
a pair of first IDT electrodes and a pair of second IDT electrodes located in a flow path;
a pair of first input conductors connected to one of the pair of first IDT electrodes and extending to an outside of the flow path;
a pair of first output conductors connected to the other of the pair of first IDT electrodes and extending to the outside of the flow path;
a pair of second input conductors connected to one of the pair of second IDT electrodes and extending to the outside of the flow path; and
a pair of second output conductors connected to the other of the pair of second IDT electrodes and extending to the outside of the flow path, wherein
a sum of line lengths in the flow path of the pair of first input conductors and the pair of first output conductors and a sum of line lengths in the flow path of the pair of second input conductors and the pair of second output conductors are equal, and wherein each of the pair of first input conductors, the pair of first output conductors, the pair of second input conductors, and the pair of second output conductors, comprises an extended conductor, the extended conductor comprising:
a first end which includes a pad located in the flow path; and
a second end, opposite the first end, located outside of the flow path.

2. The liquid specimen sensor according to claim 1, wherein
a sum of the line lengths in the flow path of the pair of first input conductors and a sum of the line lengths in the flow path of the pair of second input conductors are equal, and
a sum of the line lengths in the flow path of the pair of first output conductors and a sum of the line lengths in the flow path of the pair of second output conductors are equal.

3. The liquid specimen sensor according to claim 2, wherein
the sum of the line lengths in the flow path of the pair of first input conductors and the sum of the line lengths in the flow path of the pair of first output conductors are equal,
the sum of the line lengths in the flow path of the pair of second input conductors and the sum of the line lengths in the flow path of the pair of second output conductors are equal,
in the pair of first input conductors, the line lengths in the flow path are equal to each other,
in the pair of first output conductors, the line lengths in the flow path are equal to each other,
in the pair of second input conductors, the line lengths in the flow path are equal to each other, and
in the pair of second output conductors, the line lengths in the flow path are equal to each other.

4. The liquid specimen sensor according to claim 1, further comprising
a sensor substrate on an upper surface of which the flow path is located; and
a sensor chip comprising
a piezoelectric substrate located on the sensor substrate, and
the pair of first IDT electrodes and the pair of second IDT electrodes located on an upper surface of the piezoelectric substrate, wherein
each of the pair of first input conductors, the pair of first output conductors, the pair of second input conductors, and the pair of second output conductors, comprises a bonding wire, wherein each of the bonding wires extends from an upper surface of the sensor chip to the upper surface of the sensor substrate and is wholly located in the flow path, and
a sum of the line lengths of the bonding wires in the pair of first input conductors and the pair of first output conductors and a sum of the line lengths of the bonding wires in the pair of second input conductors and the pair of second output conductors are equal.

5. The liquid specimen sensor according to claim 4, wherein line lengths of the eight bonding wires are equal to each other.

6. The liquid specimen sensor according to claim 1, further comprising
a sensor substrate on an upper surface of which the flow path is located; and
a sensor chip comprising a piezoelectric substrate located on the sensor substrate, and the pair of first IDT electrodes and the pair of second IDT electrodes located on an upper surface of the piezoelectric substrate, wherein each of the pair of first input conductors, the pair of first output conductors, the pair of second input conductors, and the pair of second output conductors, comprises a layered conductor, wherein each of the layered conductors extends on the upper surface of the sensor substrate, and each layered conductor comprises respective ones of the first and second ends, and a sum of the line lengths in the flow path of the layered conductors of the pair of first input conductors and the pair of first output conductors and a sum of the line lengths in the flow path of the layered conductors of the pair of second input conductors and the pair of second output conductors are equal.

7. The liquid specimen sensor according to claim 6, wherein line lengths in the flow path of each of the layered conductors are equal to each other.

8. The liquid specimen sensor according to claim 6, further comprising a pair of inner wall surfaces located on the sensor substrate, facing each other, and configured to be as a side surfaces of the flow path, wherein the pair of first IDT electrodes and the pair of second IDT electrodes are arranged in a first direction crossing a facing direction of the pair of inner wall surfaces, the pair of first IDT electrodes face each other in a second direction perpendicular to the first direction, the pair of second IDT electrodes face each other in the second direction, the layered conductors in the pair of first input conductors are connected to first ends thereof located in the flow path and extend in parallel to the second direction up to one of the pair of inner wall surfaces, the layered conductors in the pair of first output conductors are connected to first ends thereof located in the flow path and extend in parallel to the second direction up to the other of the pair of inner wall surfaces, the layered conductors in the pair of second input conductors are connected to first ends thereof located in the flow path and extend in parallel to the second direction up to one of the pair of inner wall surfaces, and the layered conductors in the pair of second output conductors are connected to first ends thereof located in the flow path and extend in parallel to the second direction up to the other of the pair of inner wall surfaces.

9. A liquid specimen sensor, comprising:

a sensor substrate;

a pair of inner wall surfaces arranged on the sensor substrate, facing each other, and configured to be as a side surfaces of the flow path on the sensor substrate; and a sensor chip which is located on the sensor substrate and comprises a pair of IDT electrodes located in the flow path and on an upper surface of the sensor chip, wherein the sensor substrate comprises a pair of input layered conductors comprising first ends located in the flow path and electrically connected to one of the pair of IDT electrodes, and comprising the other ends located outside of the flow path, and a pair of output layered conductors comprising first ends located in the flow path and electrically connected to the other of the pair of IDT electrodes, and comprising the other ends located outside of the flow path, the pair of input layered conductors extend parallel to a predetermined direction from the first ends located in the flow path up to one of the pair of inner wall surfaces, and the pair of output layered conductors extend parallel to the predetermined direction from the first ends located in the flow path up to the other of the pair of inner wall surfaces.

10. The liquid specimen sensor according to claim 1, further comprising a sensor chip which is located on a bottom face of the flow path and comprises the pair of first IDT electrodes and the pair of second IDT electrodes on an upper surface the sensor chip, and a pair of barriers located at two positions sandwiching the sensor chip therebetween in a direction perpendicular to a flow direction of the flow path, and projecting upward relative to the bottom face of the flow path on an upstream side of the sensor chip.

11. The liquid specimen sensor according to claim 10, wherein upper end parts of the pair of barriers are located above the upper surface of the sensor chip.

12. The liquid specimen sensor according to claim 11, wherein the upper end parts of the pair of barriers reach an upper surface of the flow path.

13. A method of measuring a liquid specimen, which measures a property or ingredient of the liquid specimen by the liquid specimen sensor according to claim 1, comprising:

in a state filling the liquid specimen in a portion in the flow path in which the pair of first input conductors, the pair of first output conductors, the pair of second input conductors, and the pair of second output conductors are arranged, inputting a signal to the pair of first input conductors and detecting a signal output from the pair of first output conductors; and inputting a signal to the pair of second input conductors and detecting a signal output from the pair of second output conductors.

14. The liquid specimen sensor according to claim 1, wherein a sum of the line lengths in the flow path of the extended conductors of the pair of first input conductors and the pair of first output conductors and a sum of the line lengths in the flow path of the extended conductors of the pair of second input conductors and the pair of second output conductors are equal.

15. The liquid specimen sensor according to claim 1, further comprising a sensor substrate on an upper surface of which the flow path is located; and a sensor chip comprising a piezoelectric substrate located on the sensor substrate, wherein the pair of first IDT electrodes and the pair of second IDT electrodes are located on an upper surface of the piezoelectric substrate, and wherein each of the extended conductors comprises a layered conductor on the upper surface of the sensor substrate.

16. The liquid specimen sensor according to claim 1, wherein each of the pair of first input conductors, the pair of first output conductors, the pair of second input conductors, and the pair of second output conductors, comprises a bonding wire connected to the pad.

\* \* \* \* \*